United States Patent [19]

Watanabe et al.

[11] Patent Number: 4,871,976

[45] Date of Patent: Oct. 3, 1989

[54] AMPLIFIER CIRCUIT INCLUDING SINGLE CAPACITOR FOR DC DIFFERENTIAL-INPUT BALANCE

[75] Inventors: Miyoichi Watanabe, Kyoto; Shinobu Ueda, Kyogo, both of Japan

[73] Assignee: Mitsubishi Denki Kabushiki Kaisha, Tokyo, Japan

[21] Appl. No.: 200,127

[22] Filed: May 26, 1988

[30] Foreign Application Priority Data

May 27, 1987 [JP] Japan .............................. 62-130681
May 27, 1987 [JP] Japan .............................. 62-130682

[51] Int. Cl.$^4$ .............................................. H03F 3/45
[52] U.S. Cl. ........................................ 330/69; 330/84; 330/258
[58] Field of Search ............... 330/69, 84, 148, 124 R, 330/252, 258, 295, 307

[56] References Cited

U.S. PATENT DOCUMENTS 4,446,441 5/1984 Fujibayashi ............... 330/124 R X

FOREIGN PATENT DOCUMENTS 2175473 11/1986 United Kingdom .

*Primary Examiner*—James B. Mullins
*Attorney, Agent, or Firm*—Lowe, Price, LeBlanc, Becker & Shur

[57] ABSTRACT

In an amplifier circuit, there are provided a preamplifier, a first differential-input amplifier and a second differential-input amplifier. An AC negative feedback path is formed between the output terminal of the preamplifier and the inverting input terminal thereof. The inverting input terminal is connected to a ground via a RC series circuit. An input signal containing a DC voltage component is supplied via the junction of the RC series circuit to the inverting input terminal. A voltage appearing at this junction is applied to both the first and second differential-input amplifiers as a reference voltage.

11 Claims, 19 Drawing Sheets

AMPLIFIER CIRCUIT INCLUDING SINGLE CAPACITOR FOR DC DIFFERENTIAL-INPUT BALANCE

BACKGROUND OF THE INVENTION

1. Field of the Invention

The present invention generally relates to an amplifier circuit for amplifying an AC (alternating current) signal to derive signals having a plurality of desirable signal levels. More specifically, the present invention is directed to an amplifier circuit having a circuit arrangement suitable for an integrated circuit (IC).

2. Description of the Related Art

Referring now to FIG. 1, a conventional amplifier circuit will be described. This amplifier circuit is of a one-input/two-output amplifier circuit comprising a plurality of differential-input amplifiers, which amplifies one AC input signal containing a DC (direct current) voltage component so as to obtain a plurality of output signals therefrom.

In FIG. 1, the one-input/two-output amplifier circuit includes: a differential-input preamplifier 1 (simply referred to as a "preamplifier") having a non-inverting input terminal 1a; an inverting input terminal 1b; and an output terminal 1c; a first differential-input amplifier 2 (simply referred to as a "first amplifier") having a gain "kb" and connected to the output terminal 1c of the preamplifier 1. The first amplifier 2 includes a non-inverting input terminal 2a and an inverting input terminal 2b. The amplifier circuit further includes a second differential-input amplifier 3 (merely referred to as a "second amplifier") of a gain "kc" having a non-inverting input terminal 3a, and an inverting input terminal 3b; a signal input 4; a first output terminal 5 from which an output of the first amplifier 2 is derived, and a second output terminal 6 from which an output of the second amplifier 3 is derived.

The one-input/two-output amplifier circuit further includes: a resistor 7 having a resistance of "Ra₁" connected between the signal input 4 and the non-inverting input terminal 1a of the preamplifier 1; a resistor 8 having a resistance of "Ra₂" connected between the signal input 4 and the inverting input terminal 1b of the preamplifier 1; a capacitor 9 having a capacitance of "Ca" connected between the non-inverting input terminal "1b" of the preamplifier 1 and a ground; a resistor 10 having a resistance of "Rb₁" connected between the non-inverting input terminal "2a" of the first amplifier 2 and the output terminal 1c of the preamplifier 1; a resistor 11 having a resistance of "Rb₂" connected between the non-inverting input terminal "2b" of the first amplifier "2" and the output terminal 1c of the preamplifier 1; a capacitor 12 having a capacitance of "Cb" connected between the input terminal 2b of the first amplifier 2 and the ground; a resistor 13 having resistance "Rc₁" connected between the non-inverting input terminal 3a of the second amplifier 3 and the signal input 4; a resistor 14 having a resistance of "Rc₂" connected between the non-inverting input terminal 3b of the second amplifier 3 and the signal input 4; and a capacitor 15 having a capacitance of "Cc" connected between the inverting input terminal "3b" of the second amplifier 3 and the ground.

Operation of the above-described amplifier circuit as shown in FIG. 1 will now be described.

Upon receipt of an input signal containing a DC (direct current) voltage component supplied to the signal input 4, the input signal is supplied via the input resistors 7 and 8 to the non-inverting input terminal 1a and inverting input terminal 1b of the preamplifier 1, respectively. In this case, the signal input is directly supplied to the non-inverting input 1a of the preamplifier 1, whereas since an AC (alternating current) signal contained therein is bypassed via the capacitor 9 to the ground, only the DC voltage component contained therein is applied to the inverting input terminal 1b thereof. As a result, only the AC signal component of the signal input is supplied as the differential input of the preamplifier 1. This is because the lower cut-off frequency of the preamplifier 1 determined by the resistor 8 and capacitor 9 is selected to be sufficiently lower than that of the signal input.

In addition, the resistances of the input resistor 7 and 8 are equal to each other.

That is:

$$Ra_1 = Ra_2 = \qquad (1)$$

This is because generally speaking, the DC voltage difference which is produced by the DC bias current flowing through both the input terminals 1a and 1b of the differential-input preamplifier 1 and appears between the resistors, is set to be equal to each other, and then the DC balance of the differential input is to be precisely improved. It should be noted that if the characteristics of this DC voltage difference required for the preamplifier 1 (e.g., an asymmetrical distortion factor and an allowable range of DC operating-point variations for the amplifier stage succeeding to the signal input stage, and the like) are preset within a permissible range, the required resistance conditions are not limited to the above-described conditions. For instance, one input resistor 7 may be shortcircuited.

It should be understood that the above descriptions on the resistance conditions are similarly completely applicable to the remaining first and second amplifiers 2 and 3. Accordingly, in general, the resistance values of the respective input resistors are selected such that:

$$Rb_1 = Rb_2 = Rb \qquad (2)$$

$$Rc_1 = Rc_2 = Rc \qquad (3)$$

It should be noted that the following descriptions are based upon such an assumption that in order to simplify the contents of these descriptions, the input impedances of the respective amplifiers are selected to be sufficiently higher than those of the above-described resistors 10 to 14. This assumption is very commonly accepted as a method for designing an amplifier circuit and therefore is readily realized. One detailed amplifier-circuit designing method is as follows. As illustrated in FIG. 2, for instance, in the differential input amplifier circuit, if the DC current amplification factors ($h_{FE}$) of the differential transistors TR1 and TR2 are set to be high, the DC bias currents $I_{B1}$-BIAS and $I_{B2}$-BIAS are preset to be low, or the common emitter resistor $R_{E\text{-}COMMON}$ of the differential transistors TR1 and TR2 is selected to be great, the desired amplifier-circuit design can be realized. Detailed information of this known designing method is described in, for instance, the book entitled "ANALYSIS AND DESIGN OF ANALOG INTEGRATED CIRCUITS" written by P. R. GRAY and R. G. MEYER, on pages 158 to 175, by JOHN WILEY & SONS, INC.

More practically, as illustrated in a circuit diagram of FIG. 3, an emitter follower circuit is added to the differential input terminals of the differential transistors TR1 and TR2, resulting in the high input impedance of the differential amplifier stage while maintaining freedom of the design of the differential amplifier stage. This practical solution is especially utilized for an integrated circuit. Moreover, as illustrated in FIG. 4, instead of the differential transistors TR1 and TR2, field-effect transistors FET1 and FET2 may be employed to satisfy the above-described conditions.

Referring back to the circuit diagram of FIG. 1, behavior of the respective signals will now be described.

Assuming that an input signal supplied to the signal input 4 is Vi(s), the differential input of the preamplifier 1 is Vai(s), the output of the preamplifier 1 is Vao(s), the differential input of the first amplifier 2 is Vbi(s), the output of the first amplifier 2 is Vbo(s). the differential input of the second amplifier 3 is Vci(s). and the output of the second amplifier 3 is Vco(s), the following equations are given:

$$Vai(s) = \frac{RaCa \cdot s}{1 + RaCa \cdot s} \cdot Vi(s) \tag{4}$$

$$Vao(s) = Ka \cdot \frac{RaCa \cdot s}{1 + RaCa \cdot s} \cdot Vi(s) \tag{5}$$

$$Vbi(s) = \frac{RbCb \cdot s}{1 + RbCb \cdot s} \cdot Vao(s) \tag{6}$$
$$= Ka \cdot \frac{(RaCa \cdot s)(RbCb \cdot s)}{(1 + RaCa \cdot s)(1 + RbCb \cdot s)} \cdot Vi(s)$$

$$Vbo(s) = Ka \cdot Kb \cdot \frac{(RaCa \cdot s)(RbCb \cdot s)}{(1 + RaCa \cdot s)(1 + RbCb \cdot s)} \cdot Vi(s) \tag{7}$$

$$Vci(s) = \frac{RcCc \cdot s}{1 + RcCc \cdot s} \cdot Vi(s) \tag{8}$$

$$Vco(s) = Kc \cdot \frac{RcCc \cdot s}{1 + RcCc \cdot s} \cdot Vi(s) \tag{9}$$

where a symbol "s" represents a Laplace operator, or Laplacian.

Then, if the capacitances Ca, Cb and Cc of these capacitors 9, 12 and 15 are selected to be sufficiently great so as to sufficiently lower the following low cut-off frequencies "fa", "fb", and "fc" with respect to the frequency of the signal to be transmitted, i.e., $$fa = \frac{1}{2\pi RaCa} \tag{10}$$

$$fb = \frac{1}{2\pi RbCb} \tag{11}$$

$$fc = \frac{1}{2\pi RcCc} \tag{12}$$

the respective output signals Vao, Vbo and Vco as represented by the above equations (5), (7) and (9) with respect to the signal to be transmitted are given:

$$Vao = Ka \cdot Vi(s) \tag{13}$$

$$Vbo = Ka \cdot Vi(s) \tag{14}$$

$$Vco = Kc \cdot Vi(s) \tag{15}$$

Accordingly, these output signals are influenced by only the gains "ka" to "kc" of the respective amplifiers 1 to 3.

The DC signal behavior will now be considered with respect to the respective differential inputs of the amplifiers 1 to 3, s=0 in the above described equations (4), (6) and (8).

$$Vai(0) = 0 \tag{16}$$

$$Vbi(0) = 0 \tag{17}$$

$$Vci(0) = 0 \tag{18}$$

From these equations, the DC balance of the differential inputs of the respective amplifiers 1 to 3 can be maintained even if the DC voltage component contained in the signal input "Vi" varies.

As has been described above, the prior art amplifier circuit as illustrated in FIG. 1 can have the particular advantage that the differential-input DC balance can be maintained irrespective of the DC voltage component contained in the input signal. However, this amplifier circuit has a drawback that the capacitors 9, 12 and 15 for bypassing the AC signal are required for each of the amplifiers. As previously described, in order to sufficiently lower the low cut-off frequencies fa, fb, and fc with respect to the frequency of the signal to be transmitted, the capacitances of these capacitors (Ca, Cb, and Cc) must be selected to be large. Although there is another way that the resistances (Ra, Rb, Rc) of the respective input resistors are selected to be great, the following limitation to employ this solution may be provided. That is, if the resistances of the resistors become large, the high frequency characteristics are deteriorated at the non-inverting input due to the input capacitances of the respective amplifiers, and the noise characteristics of the amplifiers are deteriorated due to an increase of the resistor thermal noise.

When, for instance, the lower limit of the signal frequency to be transmitted is selected to be 100 Hz, the low cut-off frequencies fa, fb and fc must be sufficiently lower than this lower limit frequency.

If the low cut-off frequencies and the resistances of the input resistors are:

$$fa = fb = fc = 10 \text{ Hz} \tag{19}$$

$$Ra = Rb = Rc = 10 \text{ k}\Omega \tag{20},$$

and then the capacitances of the AC signal bypassing capacitors 9, 12, and 15 are given by:

$$Ca = Cb = Cc = 1.6 \text{ μF} \tag{21}$$

Accordingly, when the amplifier circuit as illustrated in FIG. 1 is fabricated in an integrated circuit (IC) under the above-described circuit design, these AC signal bypassing capacitors must be externally connected to the IC module. Moreover, if IC pins for externally connecting these capacitors to the IC module must be required, then the number of pins must be equal to that of these capacitors. In addition, when the output circuits are increased in this amplifier circuit, the following drawbacks are provided.

FIG. 5 illustrates an amplifier circuit whose output circuit is increased by 1, as compared with that of the above-described amplifier circuit shown in FIG. 1. The amplifier circuit shown in FIG. 5 includes a third amplifier 16 having a gain of "kd", a non-inverting input terminal 16a, an inverting input terminal 16b, and a third output terminal 17 from which an output of the third amplifier 16 is derived; resistors 18 and 19, and an AC signal bypassing capacitor 20 having a capacitance of "Cd". It is of course that this amplifier circuit includes the same amplifying stages as in the first-mentioned conventional amplifier circuit.

It is apparent from this example that the more the number of the amplifier stages is increased, the more the number of the AC signal bypassing capacitors is increased. As a result, the IC pins for externally connecting the capacitors to the IC module must be increased.

As is well known in the art, not only a capacitance of an AC signal bypassing capacitor but also a resistance of a resistor cannot be designed to be extremely high in an IC module. In other words, the space for occupying such a capacitor or resistor cannot be designed to be great with respect to the entire region of the IC module, or chip. In general design concept, several ten pF (pico farads) for a capacitor and several ten kΩ (kilo-ohms) for a resistor are regarded as the practical limit values in view of space availability. As a consequence, it can be readily understood that the AC bypassing capacitor having the capacitance of 1.6 $\mu$F as defined by the above equation (21) exceeds considerably over this limit value. Accordingly, this largecapacitance capacitor must be externally connected to the IC module, or chip by employing IC pins.

As previously described, since the AC signal bypassing capacitors of the conventional amplifier circuit must be employed, the number of which is equal to that of the amplifiers involved therein, the same number of the IC pins must be required for that of the AC signal bypassing capacitors when manufacturing the conventional amplifier circuit in an IC module, or chip. As a result, the size of the IC module is necessarily large, and then the large IC module must be manufactured at a higher cost.

It is therefore an object of the present invention t solve the above-described conventional drawbacks and thus provide an amplifier circuit in which the differential-input DC balance for a plurality of amplifiers involving a preamplifier (more than three amplifiers) can be effectively maintained by only a single AC-signal bypassing capacitor.

SUMMARY OF THE INVENTION

The above-described object as well as the features of the present invention ma be accomplished by providing an amplifier circuit (100;700) comprising:

one signal input (4) for receiving an input signal (Vi) containing a DC (direct current) voltage component;

a differential-input preamplifier (1) having a first input terminal (1a) for receiving one polarity input, a second input terminal (1b) for receiving the other polarity input opposite to that of the first input terminal (1a), and an output terminal (1c), said first input terminal (1a) being coupled to said one signal input (4);

a first differential-input amplifier (2) having a first input terminal (2a) for receiving one polarity input, a second input terminal (2b) for receiving the other polarity input opposite to that of the first input terminal (2a) thereof, and a first output terminal from which a first output signal (Vbo) of the amplifier circuit (100;700) is derived, said first input terminal (2a) thereof being coupled to said output terminal (1c) of said preamplifier (1);

a first resistor (24) connected between the output terminal (1c) of said preamplifier (1) and the second input terminal (1b) thereof so as to form an AC (alternating current) negative feedback path;

a series circuit constructed of a second resistor (25) and one capacitor (23), and connected between the second input terminal (1b) of said preamplifier (1) and a ground, said capacitor (23) being connected to the ground;

a third resistor (21) connected between said signal input (4) and a junction (22) of the series circuit; and, a second differential-input amplifier (3) having a first input terminal (3a) for receiving said input signal via said signal input (4), a second input terminal (3b), and a second output terminal from which a second output signal of the amplifier circuit (100;700) is derived, said second input terminal (3b) of said second amplifier (3) being connected together with said second input terminal (2b) of said first amplifier (2) to the junction (22) of said series circuit so as to apply a voltage appearing at said junction (22) to both the first and second amplifiers (2;3) as a reference voltage.

In accordance with the first basic concept of the present invention, the negative feedback path is provided with the preamplifier 1, the input signal is added via the second resistor 25 to the junction 22 between the first resistor (24) and capacitor 23 which is provided between the feedback input terminal 1b and ground, and the voltage appearing at this junction 22 is applied as the reference voltage to a plurality of differential-input amplifiers.

Moreover, the amplifier circuit (800;1100) according to the second basic concept of the invention comprises:

one signal input (4) for receiving an input signal (Vi) containing a DC (direct current) voltage component:

a differential-input preamplifier (1) having a first input terminal (1a) for receiving one polarity input, a second input opposite to that of the first input terminal (1a), and an output terminal (1c), said first input terminal (1a) being coupled to said one signal input (4);

a first differential-input amplifier (2) having a first input terminal (2a) for receiving one polarity input, a second input terminal (2b) for receiving the other polarity input opposite to that of the first input terminal (2a) thereof, and a first output terminal from which a first output signal (Vbo) of the amplifier circuit (800;1100) is derived, said first input terminal (2a) thereof being coupled to said output terminal (1c) of said preamplifier (1);

a first resistor (22) connected between the output terminal (1c) of said preamplifier (1) and the second input terminal (1b) thereof so as to form a DC negative feedback path;

one capacitor (23) connected between said second input terminal (1b) of said preamplifier (1) and a ground;

a second resistor (21) connected between said signal input (4) and a junction between one terminal of said capacitor (23) and said second input terminal (1b) of said preamplifier (1); and, a second differential-input amplifier (3) having a first input terminal (3a) for receiving said input signal via signal input (4), a second input terminal (3b), and a second output terminal from which a second output signal of the amplifier circuit (800;1100) is derived, said second input terminal (3b) of said second amplifier (3) being connected together with said second input terminal (2b) of said first amplifier (2) to said junction (4) between said one terminal of said capacitor (23) and said second input terminal (1b) of said preamplifier (1) so as to apply a voltage appearing at said junction (40) to both the first and second amplifiers (2;3) as a reference voltage.

In accordance with the amplifier circuit arranged based upon the second basic concept of the invention, the DC negative feedback is provided with the preamplifier (1), the input signal is added via the second resistor 21 to the feedback input terminal thereof, and the voltage appearing at this feedback input terminal is input as the reference voltage to a plurality of differential input amplifiers.

BRIEF DESCRIPTION OF THE DRAWINGS

For a better understanding of the present invention, reference is made to the following description in conjunction with the accompanying drawings, in which.

DETAILED DESCRIPTION OF THE PREFERRED EMBODIMENTS

BASIC CONCEPTS

The amplifier circuit according to the invention is realized based upon the following two basic concepts.

In an amplifier circuit, according to the first basic concept, constructed of at least a single preamplifier; a first differential-input amplifier connected to the output terminal of the preamplifier; and a second independent differential-input amplifier, an AC negative feedback path is provided with the preamplifier, an input signal is added via a first resistor to a junction of a series circuit consisting of a second resistor and a capacitor connected between the feedback input terminal of this preamplifier and ground, and a voltage appearing at this junction is input as a reference voltage to the first and second differential-input amplifiers.

Then, in an amplifier circuit, according to the second basic concept of the invention, constructed of at least a single preamplifier; a first differential-input amplifier connected to the output terminal of the preamplifier; and a second separate differential-input amplifier, a DC negative feedback path is provided with the preamplifier, an input signal is added via a resistor to the feedback input terminal thereof, and a voltage appearing at this negative feedback input terminal is applied as a reference voltage to the first and second differential-input amplifiers.

It should be noted that the below-mentioned first to fifth preferred embodiments are based upon the first basic concept of the invention, whereas the following sixth to ninth preferred embodiments are based upon the second basic concept of the invention.

CIRCUIT ARRANGEMENT OF FIRST AMPLIFIER CIRCUIT 100 BELONGING TO FIRST BASIC CONCEPT

Referring now to a circuit diagram shown in FIG. 6, an amplifier circuit 100, according to one preferred embodiment, arranged based on the first basic concept will be described.

Figure 1:
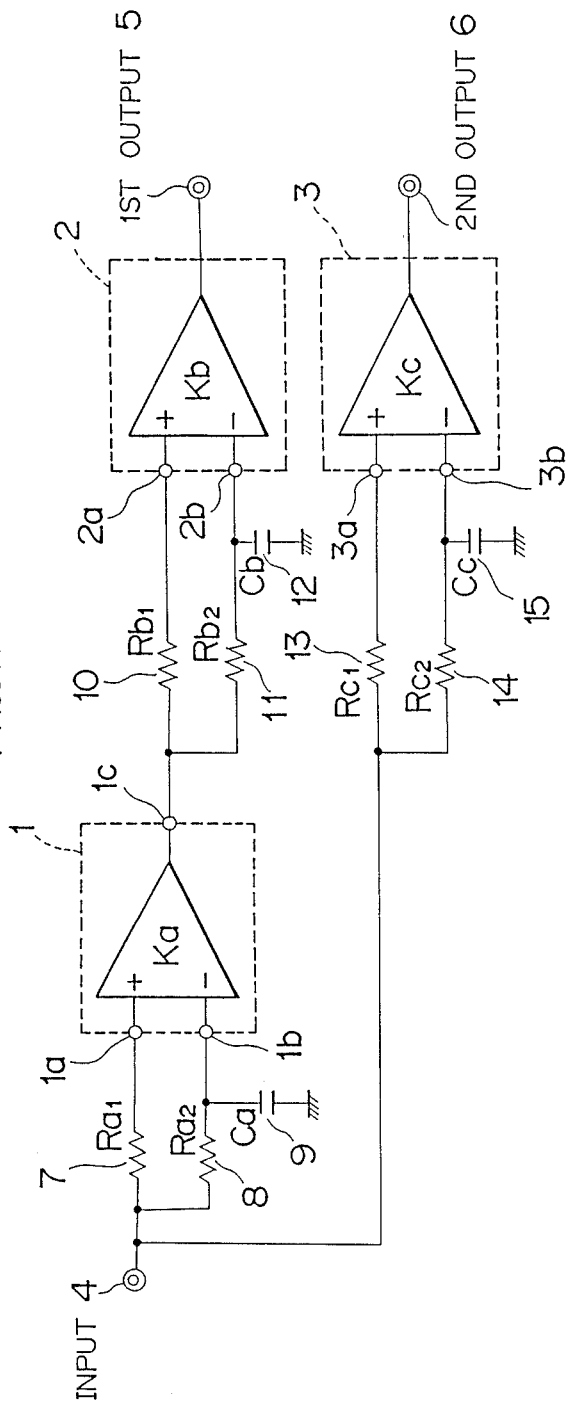
FIG. 1 is a circuit diagram of one conventional amplifier circuit.
Figure 5:
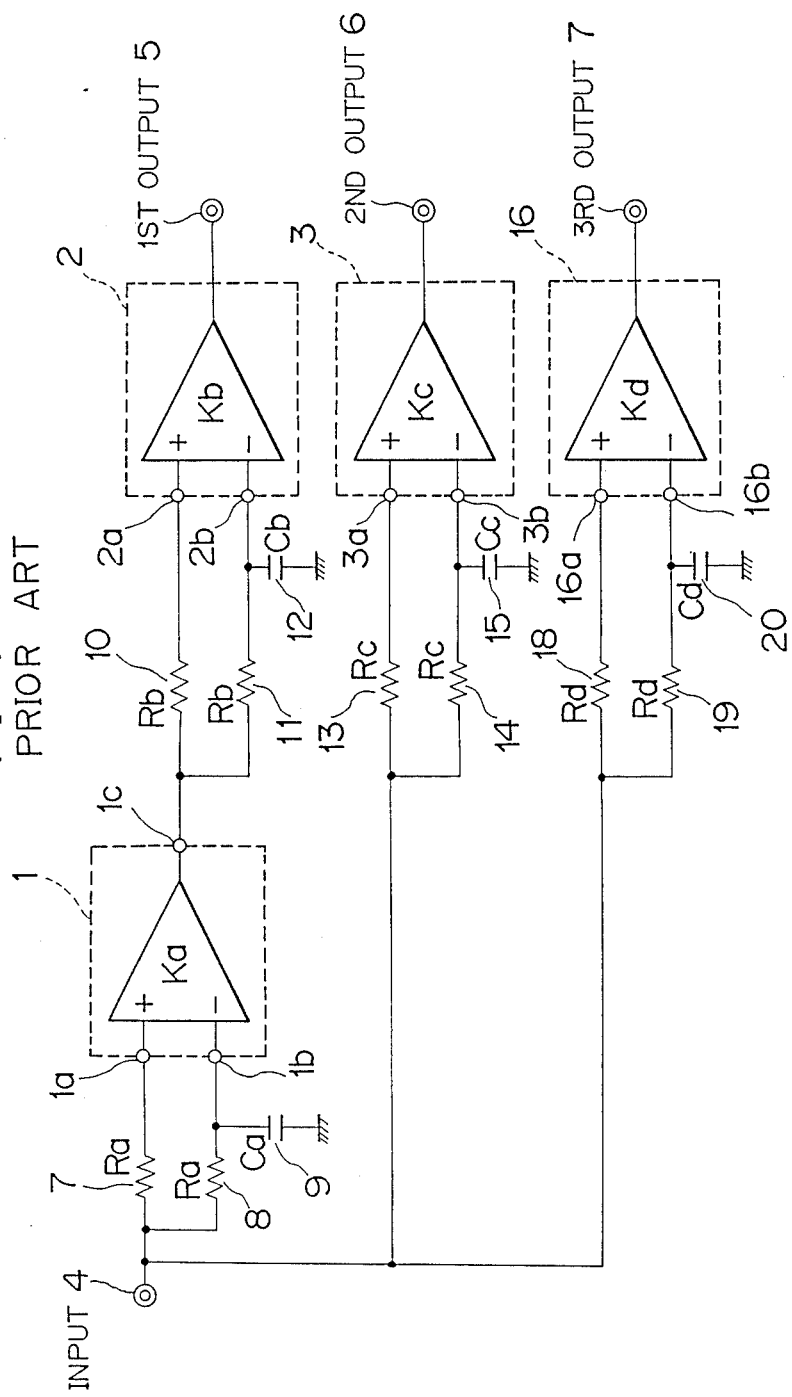
FIG. 5 is a circuit diagram of another conventional amplifier circuit.

It should be noted that the same reference numerals for denoting the circuit elements shown in FIGS. 1 and 5 will be employed to represent the same or similar circuit elements shown in the following drawings. Also, for the sake of simplicity, only differences in circuit arrangement will be described in the following circuit diagrams according to the preferred embodiments of the invention.

Figure 6:
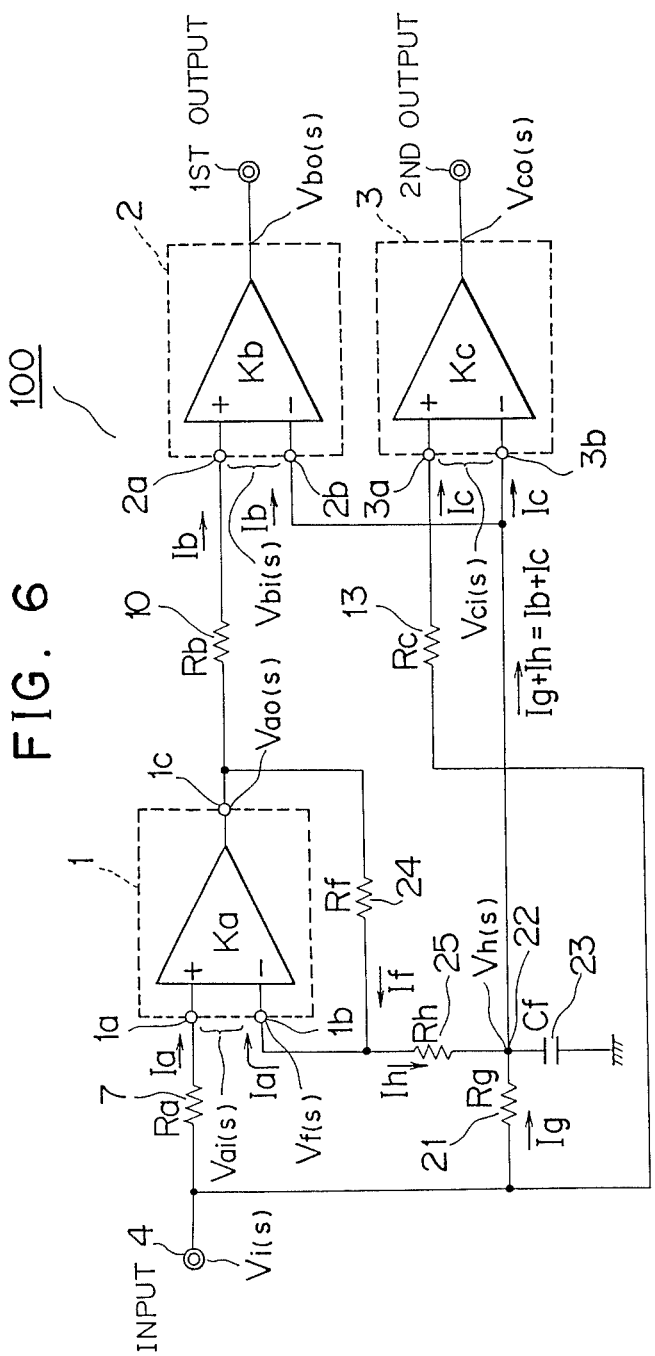
FIG. 6 is a circuit diagram of an amplifier circuit according to a first preferred embodiment of the present invention, and arranged based upon a first basic idea.

In the amplifier circuit 100 shown in FIG. 6, there are provided a resistor 21 having a resistance of "Rg" connected between the signal input 4 and the junction 22 of the series circuit; a capacitor 23 having a capacitance of "Cf" connected between this junction 22 and the ground; a resistor 24 having a resistance of "Rf" connected between the output terminal 1c of the preamplifier 1 and the inverting input terminal 1b thereof; and a resistor 25 having a resistance of "Rh" connected between the inverting input 1b of the preamplifier 1 and the junction 22. It should be noted that this junction 22 is also connected to the inverting input terminal 2b of the first amplifier 2 and the inverting input terminal 3b of the second amplifier 3.

OPERATIONS OF FIRST AMPLIFIER CIRCUIT

Operations of the amplifier circuit 100 shown in FIG. 6 will now be described. For the sake of simplicity, the input impedances of the respective amplifiers 1 to 3 are sufficiently higher than the resistances of the input resistors thereof which is similar to the conventional amplifier circuit.

In the amplifier circuit 100 shown in FIG. 6, when a signal input supplied to the signal input terminal 4 is Vi(s); the differential input of the preamplifier 1 is Vai(s); the signal output thereof is Vao(s); the input voltage of the inverting input terminal 1b thereof is Vf(s); the voltage appearing at the junction 22 is Vh(s); the differential input of the first amplifier 2 is Vbi(s); the signal output thereof is Vbo(s); the differential input of the second amplifier 3 is Vci(s) and the signal output thereof is Vco(s), the relationships between the respective signals are expressed as follows:

$$Vai(s) = Vi(s) - Vf(s) = \frac{Rg + Rh}{(1 + Ka)(Rg + Rh) + Rf} \cdot \quad (22)$$

-continued
$$1 + \frac{1 + \frac{(Rf + Rh)RgCf \cdot s}{Rg + Rh}}{1 + \frac{(Rf + (1 + Ka)Rh)RgCf \cdot s}{(1 + Ka)(Rg + Rh) + Rf}} \cdot Vi(s)$$

$$Vao(s) = Ka \cdot Vai(s) \quad (23)$$

$$Vbi(s) = Vao(s) - Vh(s) = \quad (24)$$

$$\frac{Rf + Rh}{(1 + Ka)(Rg + Rh) + Rf} \cdot$$

$$\frac{-1 + KaRgCf \cdot s}{1 + \frac{(Rf + (1 + Ka)Rh)RgCf \cdot s}{(1 + Ka)(Rg + Rh) + Rf}} \cdot Vi(s)$$

$$Vbo(s) = Kb \cdot Vbi(s) \quad (25)$$

$$Vci(s) = Vi(s) - Vh(s) = \quad (26)$$

$$\frac{Rg}{(1 + Ka)(Rg + Rh) + Rf} \cdot$$

$$\frac{1 + (Rf + (1 + Ka)Rh)Cf \cdot s}{1 + \frac{(Rf + (1 + Ka)Rh)RgCf \cdot s}{(1 + Ka)(Rg + Rh) + Rf}} \cdot Vi(s)$$

$$Vco(s) = Kc \cdot Vci(s) \quad (27)$$

Accordingly, if the capacitance "Cf" of the AC signal bypassing capacitor 23 is selected in such a manner that the frequency "ff" is sufficiently lower than the frequency of the signal to be transferred; i.e., $$ff = \frac{(1 + Ka)(Rg + Rh) + Rf}{2\pi(Rf + (1 + Ka)Rh)RgCf} \quad (28)$$

the signal outputs of the respective amplifiers 1 to 3 are given from the above-described equations (22) to (27) with respect to this signal;

$$Vao(s) = \frac{Ka}{1 + Ka \cdot \frac{Rh}{Rf + Rh}} \cdot Vi(s) \quad (29)$$

$$Vbo(s) = \frac{Ka \cdot Kb}{1 + Ka \cdot \frac{Rh}{Rf + Rh}} \cdot Vi(s) = Kb \cdot Vao(s) \quad (30)$$

$$Vco(s) = Kc \cdot Vi(s) \quad (31)$$

As is apparent from the coefficient term of the right side of the equations (29), the function of the preamplifier 1 corresponds to that of the in-phase amplifier to which the negative feedback path is applied. The features of the negative feedback amplifier are described in, for instance, the publication entitled "Operational Amplifier-Circuit Design Handbook" written by D. F. STAUT, McGraw-Hill Book k.k. showa era: 58, Column 1. That is, the transfer gain of the amplifier can depend on only the resistance values Rf and Rh of the resistors 24 and 25 respectively, if the open loop gain "Ka" of the negative feedback amplifier is selected to be sufficiently high, and $$Ka \cdot \beta \gg 1 \; (\beta = Rh/(Rf + Rh): \text{feedback ratio}) \quad (32)$$

is satisfied. In other words the signal output of the preamplifier 1 "Vao" is expressed by the equation (32);

$$Vao(s) = \frac{Rf + Rh}{Rh} \cdot Vi(s) = \frac{1}{\beta} \cdot Vi(s) \quad (33)$$

This is the initial condition to realize the major object of the invention, i.e., the DC differential input balance of the plural differential-input amplifiers, 1 to 3 can be maintained by employing only one capacitor. This fact will now be understood from the following description.

DC BALANCE FOR DIFFERENTIAL INPUT

When behavior of the DC voltages of the differential inputs of the respective amplifiers 1 through is considered, the condition: s=0 is satisfied in the above-described equations (22), (24) and (26). That is to say, the respective voltages are expressed by:

$$Vai(o) = \frac{Rg + Rh}{(1 + Ka)(Rg + Rh) + Rf} \cdot Vi(o) \quad (34)$$

$$Vbi(o) = -\frac{Rf + Rh}{(1 + Ka)(Rg + Rh) + Rf} \cdot Vi(o) \quad (35)$$

$$Vci(o) = \frac{Rg}{(1 + Ka)(Rg + Rh) + Rf} \cdot Vi(o) \quad (36)$$

It should be noted that since the resistor 26 having the resistance of "Rg" is irrelevant to the signal transfer gain in view of the equations (29), (30) and (31), this resistance value can be freely set (it is, of course, possible that the capacitance "Cf" of the capacitor 23 must be selected to be large so as to sufficiently lower the frequency "ff" of the equation (28), as compared with the frequency of the signal to be transferred. For instance, if $$Rg = Rf = Ro$$

the differential input voltages are given from the equations (34), (35), (36) as follows:

$$Vai(o) = \frac{1}{1 + Ka + \frac{Ro}{Ro + Rh}} \cdot Vi(o) < \frac{1}{1 + Ka} \cdot Vi(o) \quad (38)$$

$$Vbi(o) = \frac{1}{1 + Ka + \frac{Ro}{Ro + Rh}} \cdot Vi(o) < \frac{1}{1 + Ka} \cdot Vi(o) \quad (39)$$

$$Vci(o) = \frac{1}{(1 + Ka)\left(1 + \frac{Rh}{Ro}\right) + 1} \cdot Vi(o) < \quad (40)$$

$$\frac{1}{1 + Ka} \cdot Vi(o)$$

VOLTAGE SHIFTS IN DC COMPONENT

In other words, when the DC voltage component contained in the input signal is varied from he designed central value Vi(DC) of the corresponding amplifier to the variation ΔVi(DC), the DC differential-input unbalance of the respective amplifiers 1 to 3 appears with the reduced ΔVi(DC) less than 1/(1+Ka). As a consequence, with respect to the DC voltage variation ΔVi(DC) which may be involved in the input signal supplied to the signal input terminal 4, the gain "Ka" of the preamplifier 1 is set in such a manner that the amounts of the DC voltage unbalance caused in the respective amplifiers 1 through 3 is lower than the allowable value of the design specification. This fact can be understood from that the above-described features of the negative feedback in-phase amplifier can be directly utilized. As a result, in accordance with the preferred embodiment, the particular advantage can be achieved in that the DC differential-input balance of a plurality of amplifiers 1 through 3 can be satisfactorily maintained by employing only one capacitor, i.e., the capacitor 23 in the preferred embodiment.

BASE BIASING CURRENT

Figure 2:
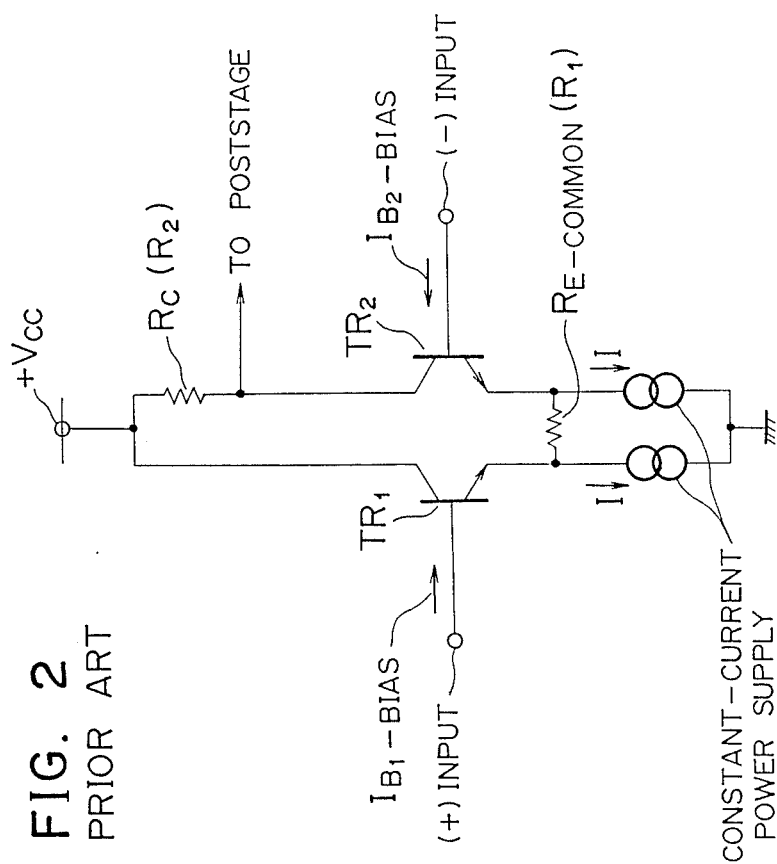
FIGS. 2, 3 and 4 are schematic circuit diagrams of the known differential amplifiers.
Figure 3:
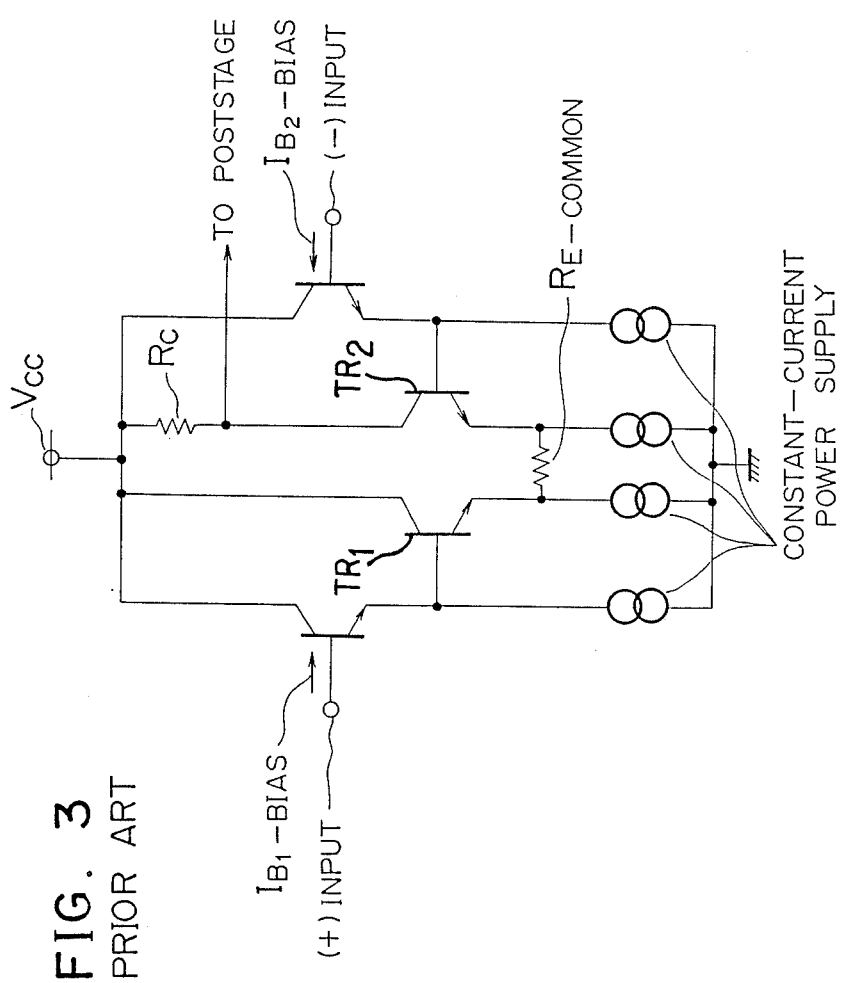
Figure 4:
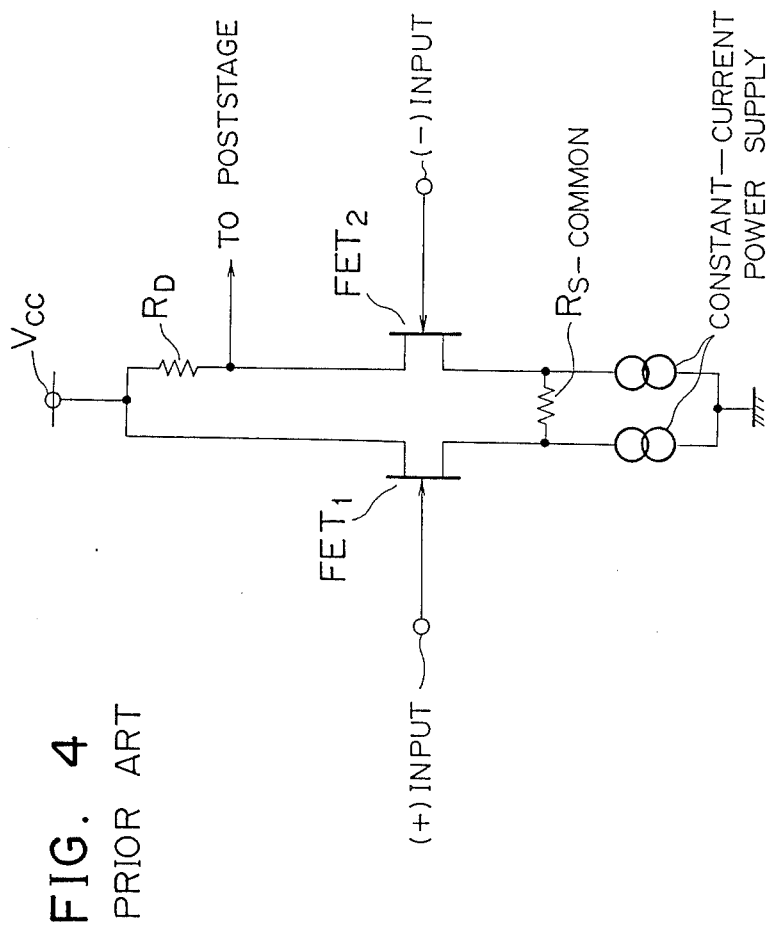

When each of the differential-input circuits of the respective amplifiers 1 through 3 as illustrated in FIG. 6 is constructed by bipolar transistors as shown in FIGS. 2 and 3, a constant base biasing current flows at the input terminal 4 thereof as follows. That is, it is assumed that the base current "Ia" flows at each of the input terminals 1a and 1b of the preamplifier 1, the base current "Ib" flows at the respective input terminals 2a and 2b of the first amplifier 2, and the base current "Ic" flows at the respective input terminals 3a and 3b of the second amplifier 3. In this case, when the current flowing through the resistor 24 having the resistance of Rf is "If", the current flowing through the resistor 21 having the resistance of Rg is "Ig", and the current flowing through the resistor 25 having the resistance of Rh is "Ih", the following equations are given:

$$Ig + Ih = Ib + Ic \tag{41}$$

$$If = Ia + Ih \tag{42}$$

As an example, the base currents are designed as follows:

$$Ia = 2Ib = 2Ic = Io \tag{43}$$

Also, when the bias design to enable the output voltage Vao(DC) of the preamplifier 1 to be equal to Vi(DC) is introduced at the designed central value Vi(DC) of the input DC voltage, this output voltage Vao(DC) is given from the equation (38):

$$Voa(o) = \frac{Ka}{1 + Ka + \frac{Rg}{Rg + Rh}} \cdot Vi(o) = Vi(o) \tag{44}$$

where the gain is defined by Ka >> 1. As a result, even if the designed central value Vi(DC) is changed, the DC output voltage of the preamplifier 1 is substantially equal to the input voltage Vi(DC) which is produced after the change in the designated central value.

Under the above-described conditions, if $$Ra = Rb/2 = Rc/2 = Rf = Rg = Ro \tag{45}$$

is preset, the following relationship is given, because the preamplifier 1 is designed under the equation (43):

$$Ra \cdot Ia = Rb \cdot Ib = Rc \cdot Ic = Ro \cdot Io \tag{46}$$

Then, since the voltage difference between both ends of the resistor 24 having the resistance of "Rf" is of course equal to Ra·Ia, $$Rf \cdot If = Ra \cdot Ia = Ro \cdot Io \tag{47}$$

is given. As a consequence, the current "Ig" flowing through the resistor 21 of "Rg" becomes:

$$Ig = Ib + Ic = Io/2 + Io/2 = Io \tag{48}$$

From the equation (45), the following equation (49) is satisfied:

$$Rg \cdot Ig = Ro \cdot Io \tag{49}$$

Accordingly, the DC voltage appearing across the resistor 25 of "Rh" becomes equal, and therefore Ih=0. This fact can be recognized from the above-described equations (41), (42), (47) and (48). With the above-described conditions, the following equation (46) is given:

$$\begin{aligned} Ra \cdot Ia &= Rb \cdot Ib = Rc \cdot Ic \\ &= Rf \cdot If = Rg \cdot Ig = Ro \cdot Io \end{aligned} \tag{46}$$

Then, the DC voltages applied to the differential input terminals of the respective amplifiers 1 to 3, become equal to each other, and thus, the DC balance can be precisely maintained. Moreover, since no DC current flows through the resistor 25 having the resistance of "Rh", this resistance value "Rh" can be determined by considering only the signal transfer gain.

It is, of course, apparent that if the DC voltage drop produced by the bias current is negligible to the allowable limit of the DC differential-input unbalance, the above-described setting conditions are out of question. For instance, it may set:

Ra=Rb=Rc=0.

CIRCUIT ARRANGEMENT OF SECOND AMPLIFIER CIRCUIT 200

In the above-described first preferred embodiment, the number of the signal output was two. In contrast, according to a second preferred embodiment shown in FIG. 7, more one signal output is increased in the same circuit form as in the conventional amplifier circuit illustrated in FIG. 5. That is, an inverting input terminal 16b of a third amplifier 16 is connected to the junction 22. In this circuit, the differential input Vdi(s) of the third amplifier 16 is as follows:

$$Vdi(s) = \frac{Rg}{(1 + Ka)(Rg + Rh) + Rf} \cdot \tag{52}$$

$$\frac{1 + (Rf + (1 + Ka)Rh)Cf \cdot s}{1 + \frac{(Rf + (1 + Ka)Rh)RgCf \cdot s}{(1 + Ka)(Rg + Rh) + Rf}} \cdot Vi(s)$$

Also, all of the differential inputs and outputs of the preamplifier 1, first amplifier 2, second amplifier 3 are the same as those of the first preferred embodiment shown in FIG. 6. Accordingly, the following equation is satisfied:

$$Vci(s) = Vdi(s) \tag{53}$$

As a consequence, the advantage of the present invention can be achieved for the differential input of this third amplifier 16. Also, the DC differential-input balance can be precisely maintained if the following conditions are set. That is to say, the following currents and resistance values are satisfied when the bias current flowing through the respective input terminals 16a, and 16b of the third amplifier 16 is "Id" and the resistance value of the resistor 18 is "Rd":

$$Ig = Ib + Ic + Id \tag{54}$$

$$\begin{aligned} Ra \cdot Ia &= Rb \cdot Ib = Rc \cdot Ic = Rd \cdot Id \\ &= Rf \cdot If = Rg \cdot Ig \end{aligned} \tag{55}$$

This advantage is similar to that of the first preferred embodiment shown in FIG. 6.

Figure 7:
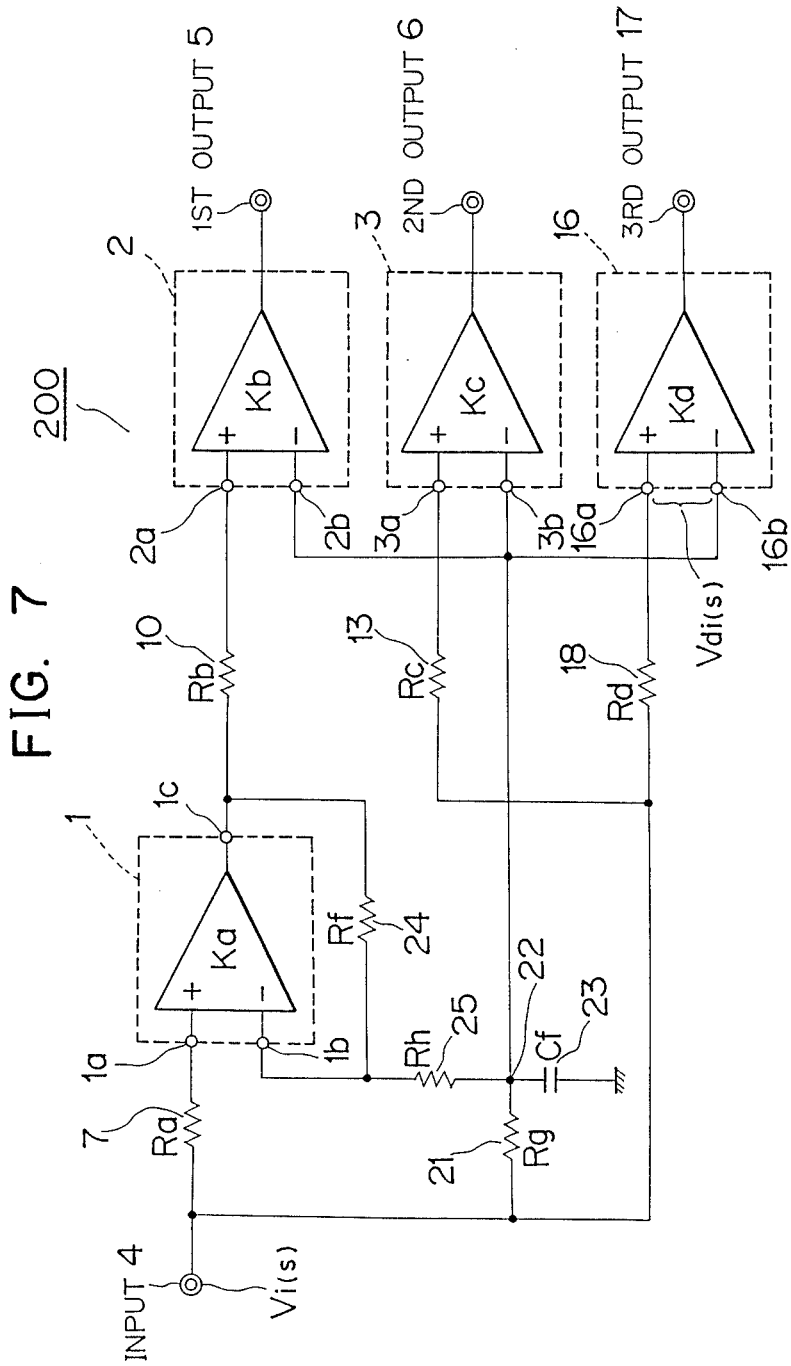
FIG. 7 is a circuit diagram of an amplifier circuit according to a second preferred embodiment of the present invention.

As has been described in detail, the amplifier circuit according to the second preferred embodiment shown in FIG. 7 is characterized in that a third amplifier 16 directly connected to the input terminal 4 of the amplifier circuit in the same fashion as in the first preferred embodiment shown in FIG. 6. To the input stage of this third amplifier 16, the preamplifier 1 is not connected, but the input signal Vi(s) is directly supplied.

As a consequence, even if the number of the signal output is increased in the similar circuit form, the effect of the invention can be equally achieved in the modified amplifier circuits having more than three signal outputs.

CIRCUIT ARRANGEMENT OF THIRD AMPLIFIER CIRCUIT 300

Referring now to a circuit diagram shown in FIG. 8, an amplifier circuit 300 according to a third preferred embodiment of the invention will be described.

Figure 8:
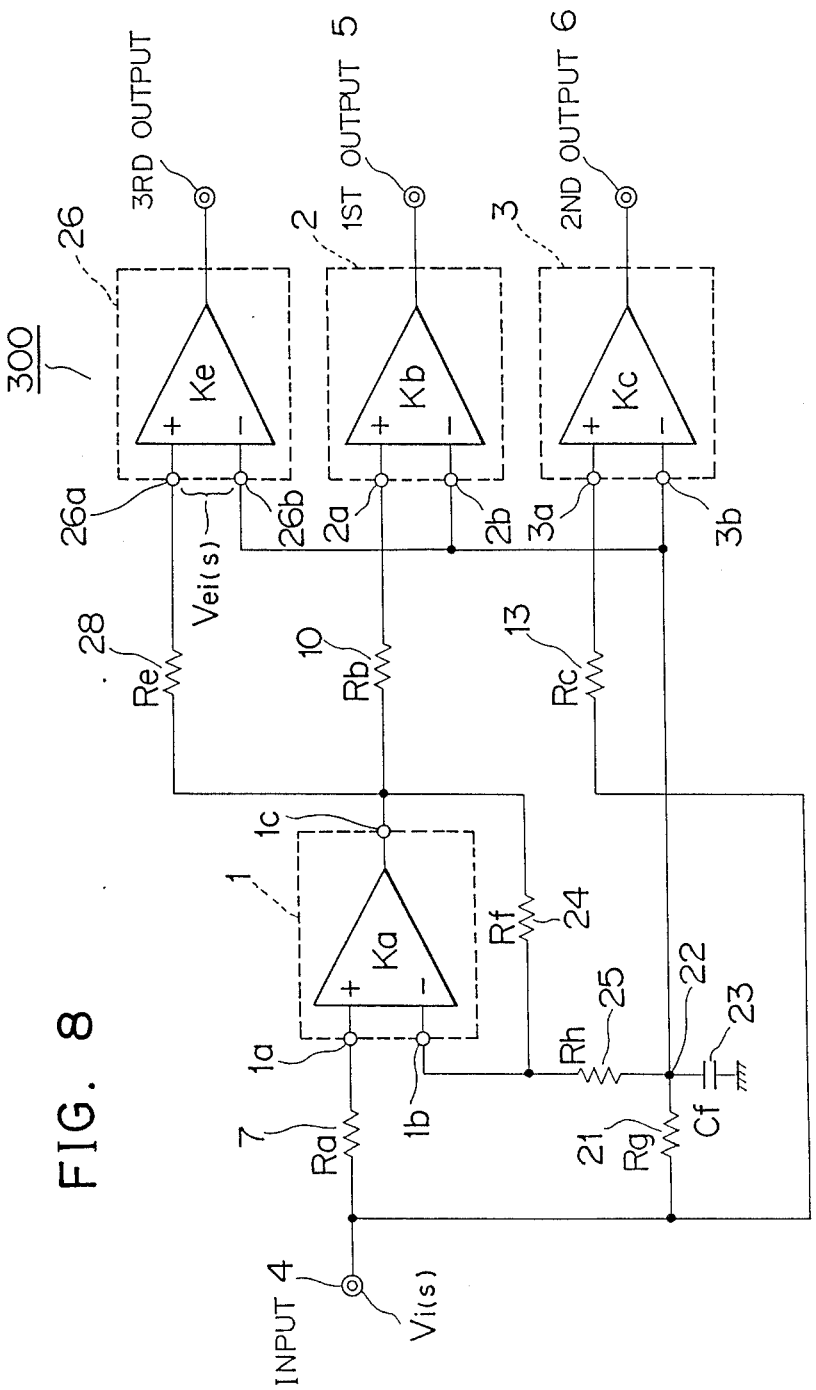
FIG. 8 is a circuit diagram of an amplifier circuit according to a third preferred embodiment of the present invention.

That is, the amplifier circuit 300 as illustrated in FIG. 8, corresponds to an amplifier circuit, the signal output number of which is increased with a different circuit form from that of the second amplifier circuit 200 shown in FIG. 7. Specifically speaking, the output from the preamplifier 1 is supplied to two amplifiers 2 and 26. In FIG. 8, the third amplifier circuit 300 further includes a third amplifier 6 having a gain of Ke, a noninverting input terminal 26a, and an inverting input terminal 26b, and a signal output terminal 27 from which the output signal of this third amplifier 26 is derived, and a resistor 28 having a resistance of "Re". The inverting input terminal 26b of the third amplifier 26 is connected to the junction 22. The differential input Vei(s) of this third amplifier 26 is equal to:

$$Vei(s) = \frac{Rf + Rh}{(1 + Ka)(Rg + Rh) + Rf} \cdot \frac{-1 + KaRgCf \cdot s}{1 + \frac{(Rf + (1 + Ka)Rh)RgCf \cdot s}{(1 + Ka)(Rg + Rh) + Rf}} \cdot Vi(s) \quad (56)$$

All of the differential inputs and the outputs of the preamplifier 1, first amplifier 2 and second amplifier 3 are the same as those of the first preferred embodiment shown in FIG. 6. Therefore, the following equation is satisfied:

$$Vbi(s) = Vei(s) \quad (57)$$

Then, the effect of the present invention can be similarly achieved in the differential input of the third amplifier 26. Similarly, the DC differential input balance can be precisely maintained when the currents and resistance values are preset so as to satisfy the following equations under the condition that the base bias current flowing through the respective input terminals of the third amplifier 26 is defined as "Ie".

amplifier 26 is defined as "Ie".

$$Ig = Ib + Ic + Ie \quad (58)$$

$$Ra \cdot Ia = Rb \cdot Ib = Rc \cdot Ic = Re \cdot Ie \quad (59)$$
$$= Rf \cdot If = Rg \cdot Ig$$

As is easily understood from the foregoing, the advantage of the present invention can be realized in all amplifiers having a similar output form even if more amplifiers are connected to the amplifier circuit 300. That is to say, more than three amplifiers may be parallel-connected to the output side of the preamplifier 1, in an amplifier circuit similar to the amplifier circuit 300.

CIRCUIT ARRANGEMENT OF FOURTH AMPLIFIER CIRCUIT 400

Figure 9:
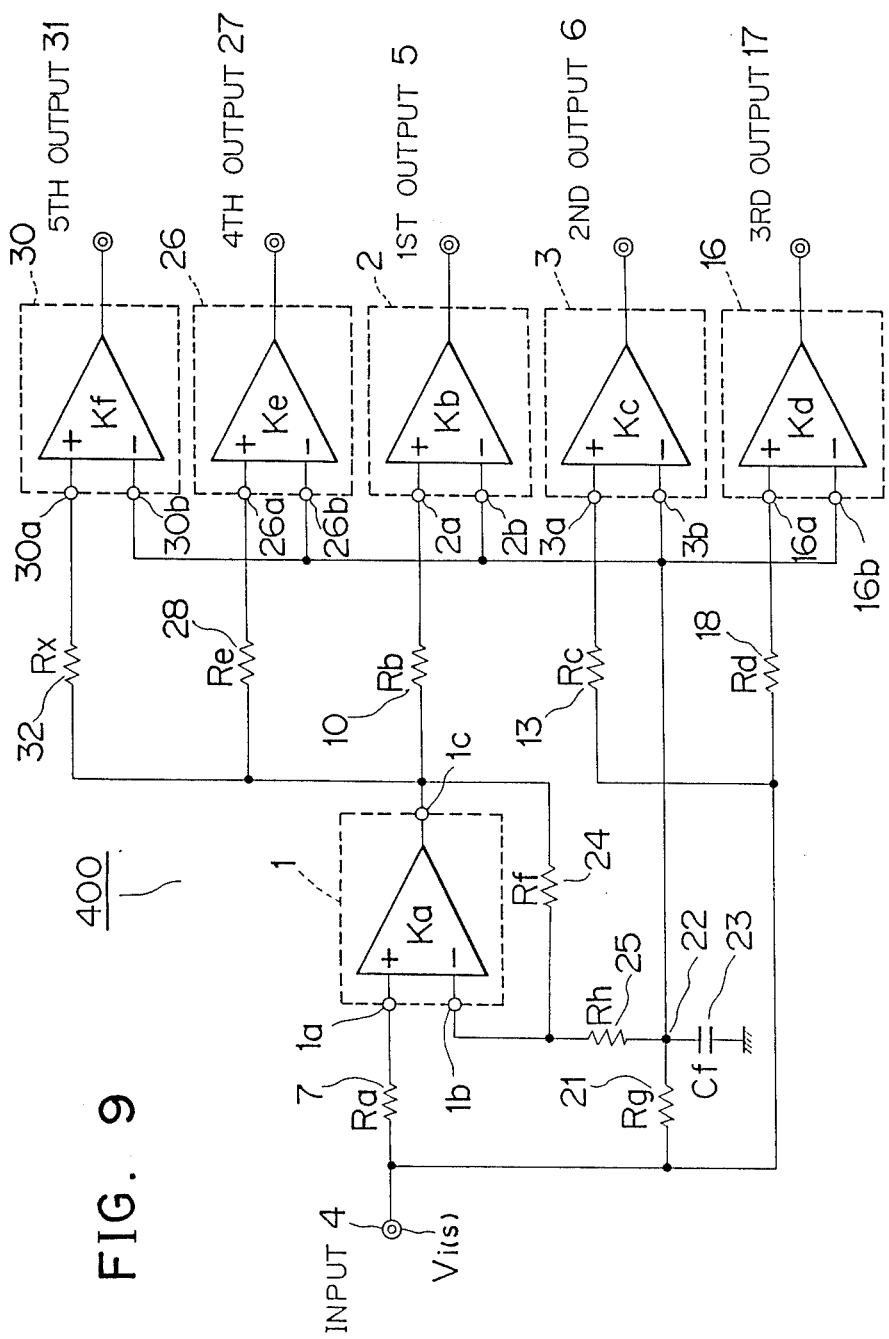
FIG. 9 is a circuit diagram of an amplifier circuit according to a fourth preferred embodiment of the present invention.

Referring to a circuit diagram shown in FIG. 9, an amplifier circuit 400 according to a fourth preferred embodiment of the invention will now be summarized.

The features of this fourth amplifier circuit 400 are as follows. The fourth amplifier circuit 400 is characterized in that a fifth amplifier 30 is employed with having the same parallel connection form as the fourth amplifier 26, which is connected to the output stage of the preamplifier 1, as illustrated in FIG. 9, i.e., the combination between the second and third preferred embodiments as shown in FIGS. 7 and 8.

Similarly, also in the fourth amplifier circuit 400 shown in FIG. 9, the advantage of the present invention can be achieved. That is to say, the DC differential-input balance can be very precisely maintained by employing only one capacitor 23.

CIRCUIT ARRANGEMENT OF FIFTH AMPLIFIER

Figure 10:
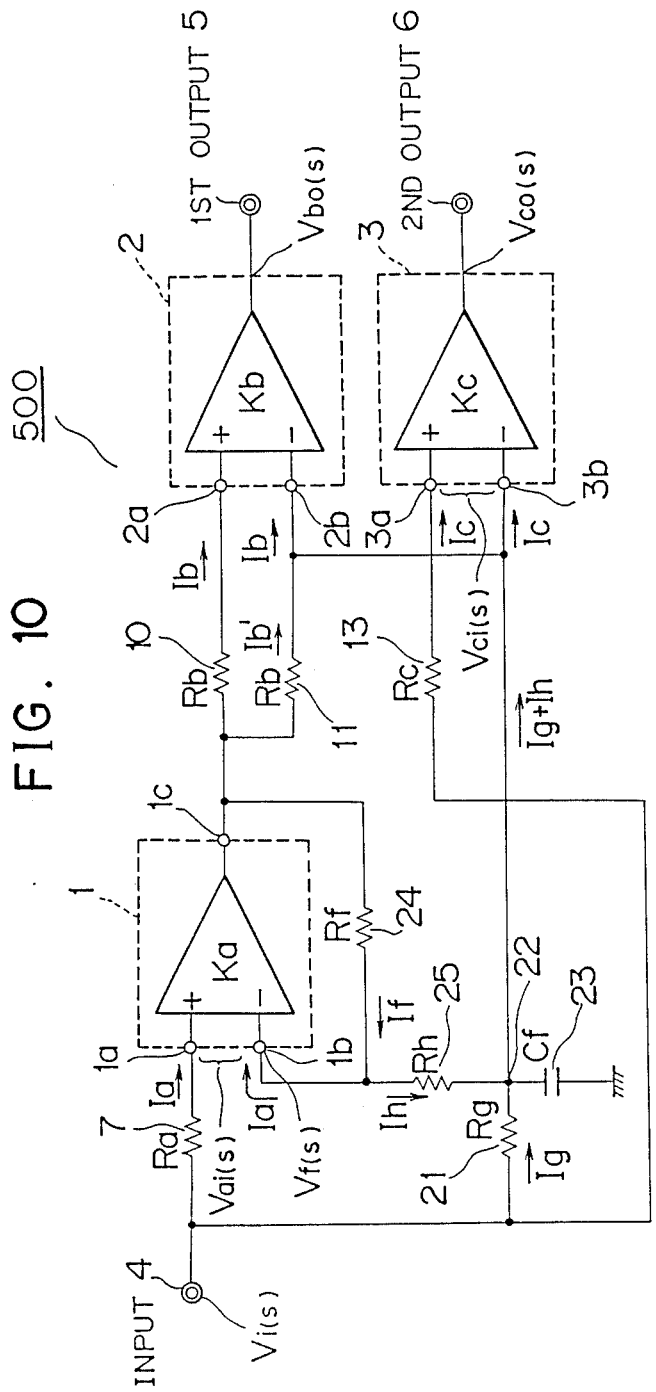
FIG. 10 is a circuit diagram of an amplifier circuit according to a fifth preferred embodiment of the present invention.

Referring to FIG. 10, a description will now be made of an amplifier circuit 500 according to a difth preferred embodiment of the invention.

Briefly stated, this fifth amplifier circuit 500 shown in FIG. 10 is realized by merely adding a resistor 11 having a resistance value of "Rb" to the other input resistor 10 of the first amplifier 2.

In this case, if the resistors 10 and 11 are selected to be "Rb", the base bias current Ib' flowing through the resistor 11 is given by:

$$Ib' = Ib \quad (60)$$

That is, when the currents are so designed that:

$$Ia = Ib = Ic = Io \quad (61),$$

the resistances of the following resistors are set as follows:

$$Ra \cdot Ia = Rb \cdot Ib = Rc \cdot Ic = Rf \cdot If \quad (62)$$
$$= Rg \cdot Ig = Ro \cdot Io$$

As a result, the following relationship can be achieved:

$$If = Ia = Ig = Ic = Io \quad (63)$$

Consequently, the relationship among the resistors are given by:

$$Ra = Rb = Rc = Rf = Rg = Ro \quad (64)$$

That is, the current "Ig" is equal to the current "Ic" in the above example. No base bias current is supplied from the junction 22 to the inverting input terminal 2b of the first amplifier 2, but the base bias current is supplied from the signal output of the preamplifier 1 via the resistor 11 to the inverting input terminal 2b. Also in this case, the condition Ih=0 can be satisfied, and all of the DC voltage applied to the input terminals of the respective amplifiers 1 through 3 are equal to each other, which is similar to the first preferred embodiment shown in FIG. 6.

It should be noted that since the resistor 11 is provided in the amplifier circuit 500, equations for indicating the signal transfer characteristic are different from those of the first amplifier circuit 100 shown in FIG. 6. That is, these signal transfer characteristic equations are given as follows:

$$Vai(s) = \frac{(Rg + Rh)Rb + (Rf + Rh)Rg}{(1 + Ka)((Rg + Rh)Rb + (Rf + Rh)Rg) + RfRb} \times \frac{1 + \frac{(Rf + Rh)RgRbCf \cdot s}{(Rg + Rh)Rb + (Rf + Rh)Rg}}{1 + \frac{(Rf + (1 + Ka)Rh)RgRbCf \cdot s}{(1 + Ka)((Rg + Rh)Rb + (Rf + Rh)Rg) + RfRb}} \cdot Vi(s) \tag{65}$$

$$Vao(s) = Ka \cdot Vai(s) \tag{66}$$

$$Vbi(s) = \frac{(Rf + Rh)Rb}{(1 + Ka)((Rg + Rh)Rb + (Rf + Rh)Rg) + RfRb} \times \frac{-1 + KaRgCf \cdot s}{1 + \frac{(Rf + (1 + Ka)Rh)RgRbCf \cdot s}{(1 + Ka)((Rg + Rh)Rb + (Rf + Rh)Rg) + RfRb}} \cdot Vi(s) \tag{67}$$

$$Vbo(s) = Kb \cdot Vbi(s) \tag{68}$$

$$Vci(s) = \frac{Rg(Rf + Rh + Rb)}{(1 + Ka)((Rg + Rh)Rb + (Rf + Rh)Rg) + RfRb} \times \frac{1 + \frac{(Rf + (1 + Ka)Rh)RbCf \cdot s}{Rf + Rh + Rb}}{1 + \frac{(Rf + (1 + Ka)Rh)RgRbCf \cdot s}{(1 + Ka)((Rg + Rh)Rb + (Rf + Rh)Rg) + RfRb}} \cdot Vi(s) \tag{69}$$

$$Vco(s) = Kc \cdot Vci(s) \tag{70}$$

As a consequence, if the capacitance "Cf" of the capacitor 23 is selected to be great in order to sufficiently lower the frequency "ff" with respect to the frequency of the signal to be transmitted, i.e., $$ff = \frac{(1 + Ka)((Rg + Rh)Rb + (Rf + Rh)Rg) + RfRb}{2\pi(Rf + (1 + Ka)Rh)RgRbCf}, \tag{71}$$

then the outputs of the respective amplifiers 1 to 3 are expressed from the equations (65) to (70):

$$Vao(s) = \frac{Ka}{1 + Ka \cdot \frac{Rh}{Rf + Rh}} \cdot Vi(s) \tag{72}$$

$$Vbo(s) = \frac{Ka \cdot Kb}{1 + Ka \cdot \frac{Rh}{Rf + Rh}} \cdot Vi(s) \tag{73}$$

$$Vco(s) = Kc \cdot Vi(s) \tag{74}$$

It is apparent that these equations of the fifth preferred embodiment are similar to the above-described equations (29) and (30) of the first preferred embodiment shown in FIG. 6, and the signal transfer characteristic is completely equal to that of the first preferred embodiment.

Considering the behavior of the DC differential-input voltages of the respective amplifiers 1 to 3, the following equations are obtained if s=0 in the above-described equations (65), (67) and (69):

$$Vai(o) = \frac{(Rg + Rh)Rb + (Rf + Rh)Rg}{(1 + Ka)((Rg + Rh)Rb + (Rf + Rh)Rg) + RfRb} \cdot Vi(o) \tag{75}$$

$$Vbi(o) = \frac{(Rf + Rh)Rb}{(1 + Ka)((Rg + Rh)Rb + (Rf + Rh)Rg) + RfRb} \cdot Vi(o) \tag{76}$$

$$Vci(o) = \frac{Rg(Rf + Rh + Rb)}{(1 + Ka)((Rg + Rh)Rb + (Rf + Rh)Rg) + RfRb} \cdot Vi(o) \tag{77}$$

As an example, if the resistance values are set as in the above equation (64), then the following results are obtained:

$$Vai(o) = \frac{1}{1 + Ka + \frac{1}{2(1 + Rh/Ro)}} \cdot Vi(o) < \frac{1}{1 + Ka} \cdot Vi(o) \tag{78}$$

$$Vbi(o) = \frac{1}{2(1 + Ka) + \frac{1}{1 + Rh/Ro}} \cdot Vi(o) < \frac{1}{2(1 + Ka)} \cdot \tag{79}$$

$$Vi(o) < \frac{1}{1 + Ka} \cdot Vi(o)$$

$$Vci(o) = \frac{1}{(1 + Ka) \frac{1 + Rh/Ro}{1 + Rh/2Ro} + \frac{1}{2 + Rh/Ro}} \cdot \tag{80}$$

$$Vi(o) < \frac{1}{1 + Ka} \cdot Vi(o)$$

It is obvious that these results are similar to the above-described equations (38) to (40) of the first preferred embodiment, and therefore, the descriptions on the first preferred embodiment shown in FIG. 6 can be directly adopted into this preferred embodiment.

MODIFICATIONS

Various modifications which are constructed based upon the first basic concept will now be briefly described.

Figure 11:
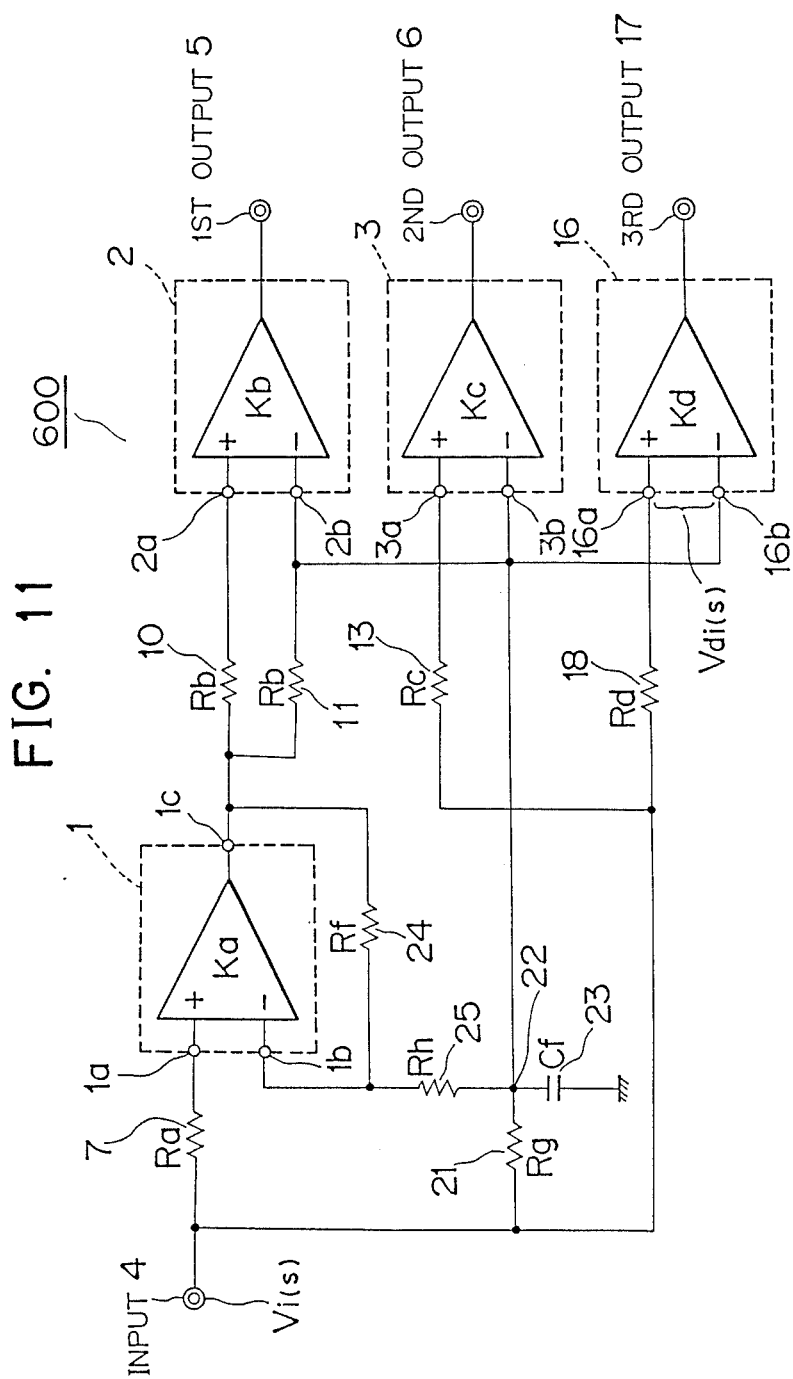
FIGS. 11 and 12 are circuit diagrams of amplifier circuits according to modifications of the invention, arranged based upon the first basic idea.

First, an amplifier circuit 600 illustrated in FIG. 11 is so arranged that the amplifier circuit 500 of the fifth preferred embodiment shown in FIG. 10 is combined with the amplifier circuit 200 of the second preferred embodiment illustrated in FIG. 7.

Figure 12:
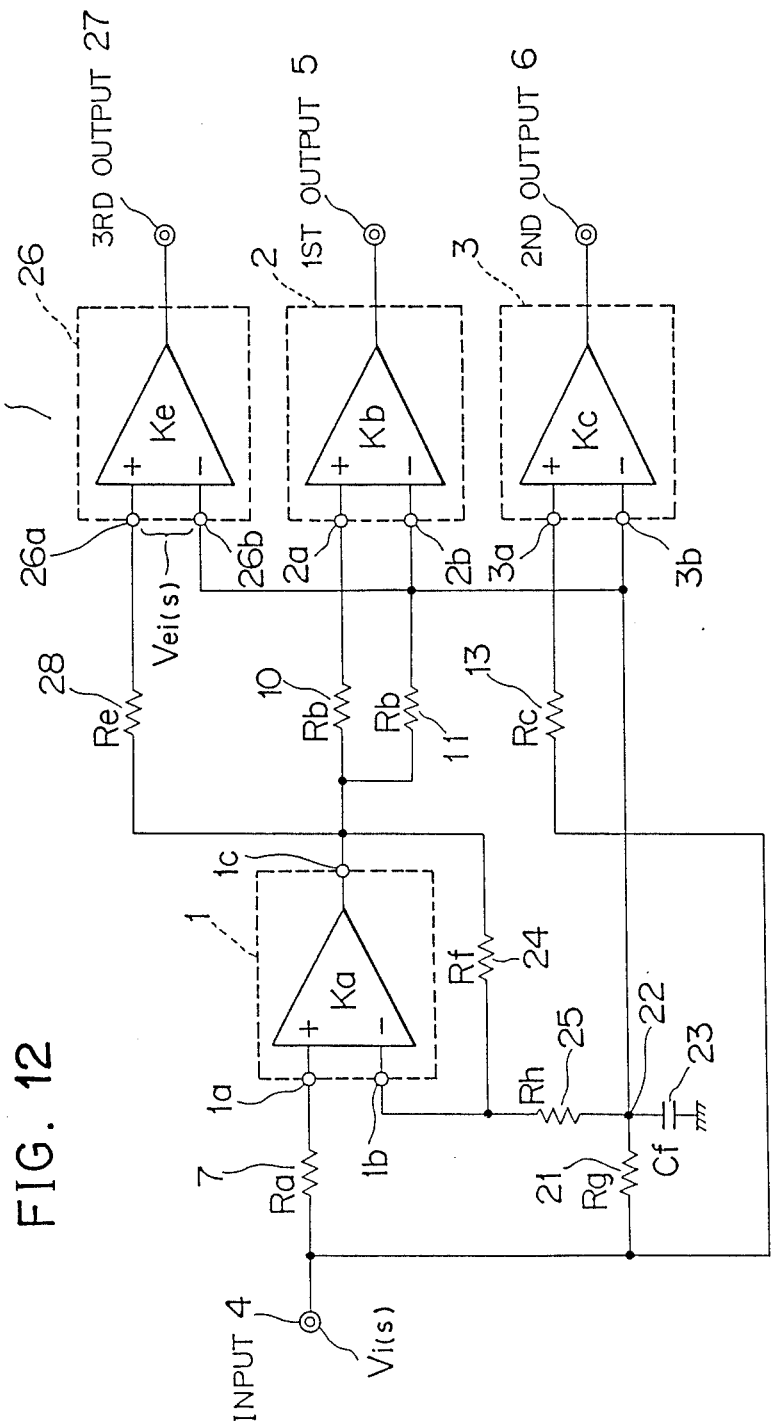

Moreover, secondly, an amplifier circuit 700 illustrated in FIG. 12 is so arranged that the amplifier 300 of the third preferred embodiment shown in FIG. 8 is combined with the amplifier 500 of the fifth preferred embodiment shown in FIG. 10.

In addition, in the above-described preferred embodiments, all of the amplifiers from which the output signals are obtained were constructed as the in-phase amplifiers. It may be possible to construct them as the opposite-phase amplifiers. That is to say, the phase of the output signal of the amplifiers may be determined based upon the need for deriving either an in-phase polarity signal, or an opposite-phase polarity signal derived from the respective amplifiers. It is of course apparent that even if the phase of the amplifier is selected based on the desired polarity signal, no advantage of the present invention is changed.

CIRCUIT ARRANGEMENT OF SIXTH AMPLIFIER CIRCUIT 800 BELONGING TO SECOND BASIC CONCEPT

Referring now to a circuit diagram illustrated in FIG. 13, an amplifier circuit 800 according to a sixth preferred embodiment belonging to the second basic concept will be described.

Since the amplifier circuit 800 shown in FIG. 13, employs the similar circuit arrangement to that of the first amplifier circuit 100 shown in FIG. 6, only the specific circuit arrangement will now be described.

Figure 13:
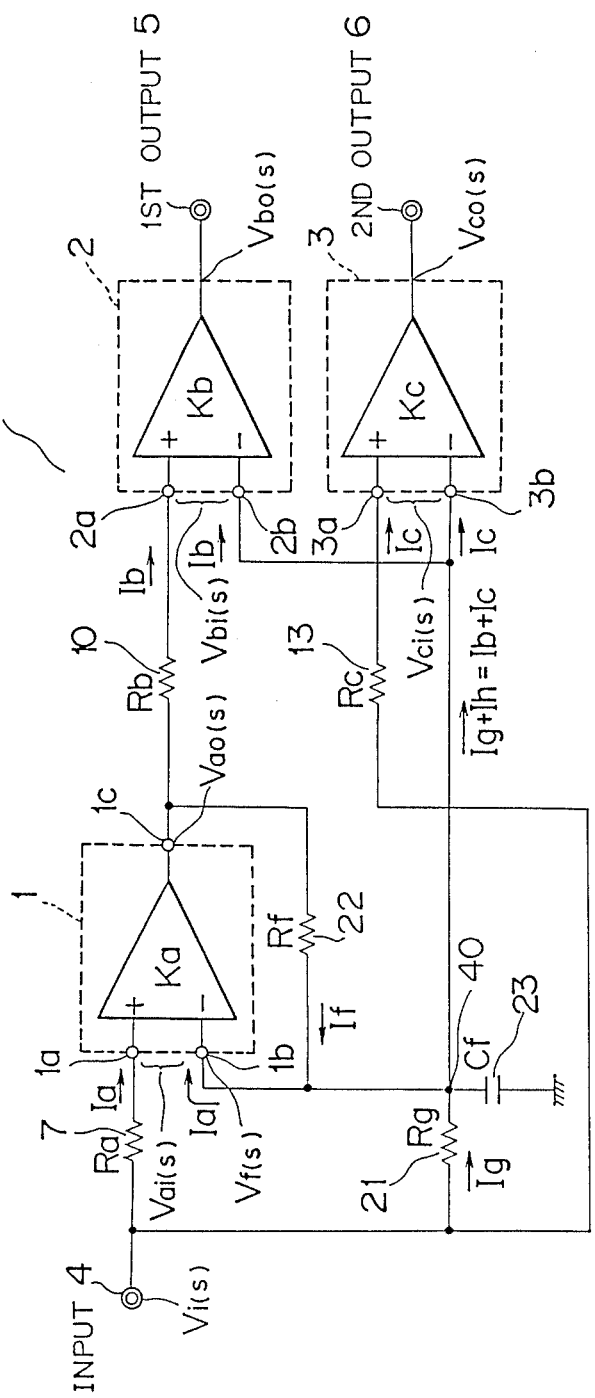
FIG. 13 is a circuit diagram of an amplifier circuit according to a sixth preferred embodiment of the invention, and arranged based upon the second basic idea.

The amplifier circuit 800 illustrated in FIG. 13 further includes a resistor 21 having a resistance of "Rg" connected between the signal input terminal 4 and the inverting input terminal 1b of the preamplifier 1, a resistor 22 having a resistance of "Rf" connected between the output terminal "1cp" of the preamplifier 1 and the inverting input terminal 1b thereof, and the capacitor 23 connected between the inverting input terminal 1b (a junction 40) and the ground.

In other words, a difference between this amplifier circuit 800 and the amplifier circuit 100 according to the first basic idea is that no feedback resistor 25 employed in the amplifier circuit 100 is connected between the inverting input terminal 1b of the preamplifier 1 and the DC input balancing capacitor 23 so a to feedback the AC signal.

DC DIFFERENTIAL-INPUT BALANCING

Operations of the amplifier circuit 800 according to the second basic idea will now be described. It should be noted that for the sake of simplicity, the input impedances of the respective amplifiers 1 to 3 are sufficiently high, in a manner similar to the previous preferred embodiments.

In the amplifier circuit 800 as illustrated in FIG. 13, if a differential input of the preamplifier 1 is Vai(s); an output signal of this preamplifier 1 is Vao(s); a signal input supplied to the input signal terminal 4 is Vi(s); a voltage applied to the inverting input terminal 1b of the preamplifier 1 is Vf(s); a differential input of the first amplifier 2 is Vbi(s); an output signal of this first amplifier 2 is Vbo(s); and a differential input of the second amplifier 3 is Vci(s) whereas an output thereof is Vco(s), the following equations are obtained:

$$Vai(s) = Vci(s) = Vi(s) - Vf(s) \quad (81)$$
$$= \frac{Rg}{(1 + Ka)Rg + Rf} \cdot \frac{1 + RfCf \cdot s}{1 + \frac{RgRfCf \cdot s}{(1 + Ka)Rg + Rf}} \cdot Vi(s)$$

$$Vao(s) = Ka \cdot Vai(s) \quad (82)$$
$$= Ka \cdot \frac{Rg}{(1 + Ka)Rg + Rf} \cdot \frac{1 + RfCf \cdot s}{1 + \frac{RgRfCf \cdot s}{(1 + Ka)Rg + Rf}} \cdot Vi(s)$$

$$Vbi(s) = Vao(s) - Vf(s) \quad (83)$$
$$= \frac{Rf}{(1 + Ka)Rg + Rf} \cdot \frac{-1 + KaRgCf \cdot s}{1 + \frac{RgRfCf \cdot s}{(1 + Ka)Rg + Rf}} \cdot Vi(s)$$

$$Vbo(s) = Kb \cdot Vbi(s) \quad (84)$$
$$= Kb \cdot \frac{Rf}{(1 + Ka)Rg + Rf} \cdot \frac{-1 + KaRgCf \cdot s}{1 + \frac{RgRfCf \cdot s}{(1 + Ka)Rg + Rf}} \cdot Vi(s)$$

$$Vco = Kc \cdot \frac{Rg}{(1 + Ka)Rg + Rf} \cdot \frac{1 + RfCf \cdot s}{1 + \frac{RgRfCf \cdot s}{(1 + Ka)Rg + Rf}} \cdot Vi(s) \quad (85)$$

As a consequence, if the capacitance "Cf" of the capacitor 23 is set to be great in order that the frequency "ff" sufficiently becomes low with respect to the frequency of the signal to be transmitted:

$$ff = \frac{(1 + Ka)Rg + Rf}{2\pi RgRfCf} \quad (86)$$

then the above-described equations (82), (84) and (85) are expressed with respect to the transmitted signal:

$$Vao(s) = Ka \cdot Vi(s) \quad (87)$$

$$Vbo(s) = Ka \cdot Kb \cdot Vi(s) \quad (88)$$

$$Vco(s) = Kc \cdot Vi(s) \quad (89)$$

It can be understood that the output signals of the respective amplifiers 1 to 3 depend upon only their gains "Ka" to "Kc".

On the other hand, as to the behavior of the DC voltages, the differential inputs for the respective amplifiers 1 to 3 are considered. If s=0 in the above-described equations (81) and (83), these differential inputs are expressed as follows:

$$Vai(0) = Vci(0) \quad (90)$$
$$= \frac{Rg}{(1 + Ka)Rg + Rf} \cdot Vi(0)$$

$$Vbi(0) = -\frac{Rf}{(1 + Ka)Rg + Rf} \cdot Vi(0) \quad (91)$$

From the above-described equations (87) to (89), the following example is considered under the condition $$Rf = Rg \quad (92),$$

since the resistance values "Rf" and "Rg" of the resistors 22 and 21 can be selected irrelevant to the signal transfer characteristic. That is to say, $$|Vai(0)| = |Vci(0)| = |Vbi(0)| \tag{93}$$
$$= \frac{1}{2+Ka} \cdot |Vi(0)|$$

From the above-described results, the following fact can be found. When the DC component contained in the input signal Vi(s) is varied from the designed central value Vi(DC) of the amplifier to the variation Vi(DC), the DC unbalance of the differential inputs for the respective amplifiers 1 through 3 appears under the condition that the variation $\Delta$Vi(DC) is reduced by $1/(2+Ka)$. Consequently, the gain "ka" of the preamplifier 1 may be set in such a manner that the amounts of the differential-input unbalance occurring in the respective amplifiers are lower than the permissible values of the design specification.

AMPLITUDE LIMITER

To clearly represent the advantages of this preferred embodiment based upon the second basic idea with respect to this point, the following example may be helpful. That is, the first differential amplifier 2 functions as a nonlinear amplifier, precisely speaking, an amplitude limiter (simply, referred to as a "limiter").

Figure 14A:
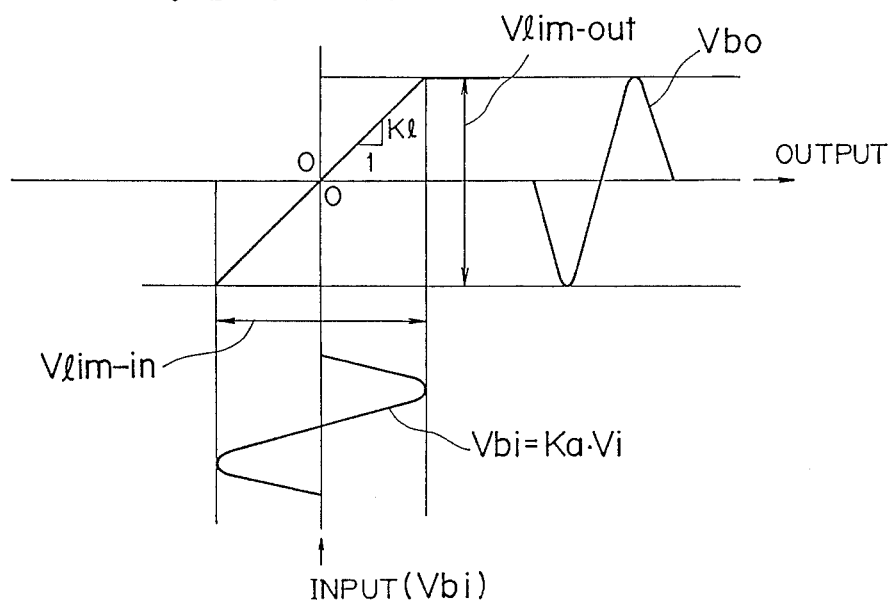
FIGS. 14A, 14B, 15A and 15B are graphic representations on input/output characteristics for a limiter shown in FIG. 13.

FIG. 14A represents a graphical representation of an input/output characteristic of the limiter (i.e., the first amplifier 2). In the graphical representation, Vlim-out indicates a maximum output (a peak-to-peak value), and Vlim-in denotes an amplitude (a peak-to-peak value) of an input signal at which the limiting effect starts in active. When the signal input is lower than Vlim-in, it is linear-amplifiered, whereas when the signal input is higher than Vlim-in, the signal output of this limiter is suppressed to Vlim-out. That is, the signal input is amplitude-limited.

To achieve the input/output characteristic, as illustrated in FIG. 14A, by employing concrete circuit means, the differential amplifier circuit shown in FIG. 2 is usually utilized, for example. In the differential amplifier of FIG. 2, when the resistance of the common emitter resistor $R_{E\text{-}COMMON}$ is selected to be "R1"; the resistance of the collector resistor Rc is "R2"; the currents flowing through the respective constant-current power supplies are "I"; and the emitter dynamic resistances "re" of the differential transistors TR1 and TR2 are defined by $r \ll R1$, the following equations are obtained:

$$Vlim\text{-}out = 2IR_2 \tag{94}$$
$$Vlim\text{-}in = 2IR_1 \tag{95}$$
$$K1 = R_2/R_1 \text{ (a small-signal linear gain)} \tag{96}$$

Figure 14B:
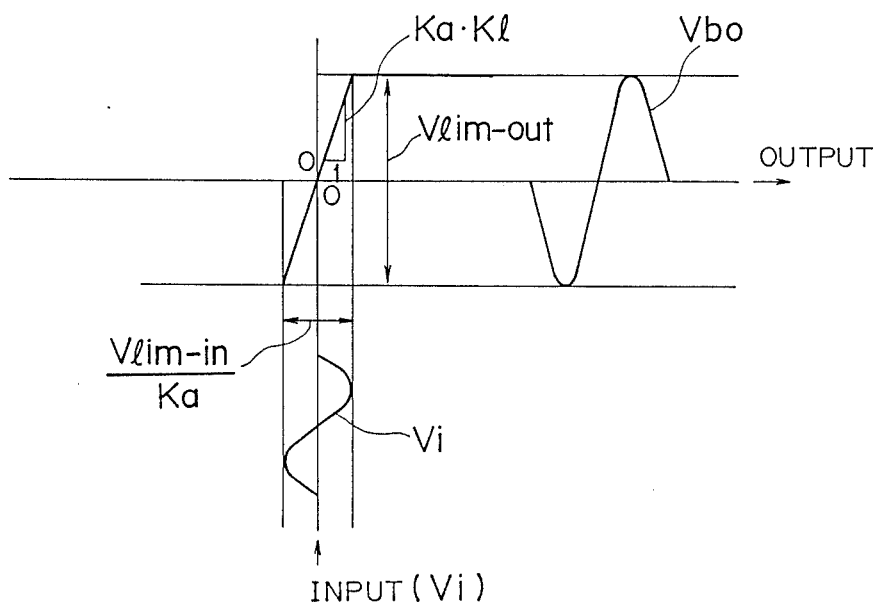

It is understood that since the preamplifier 1 is employed in the limiter shown in FIG. 13, the input/output characteristic of the circuit arranged by the signal input terminal 4 through the first output terminal 5 is represented in FIG. 14B. That is to say, this preamplifier 1 plays a role in such a manner that the input signal level transferred from the linear operation to the nonlinear operation is equivalently moved into the small amplitude region.

Figure 15A:
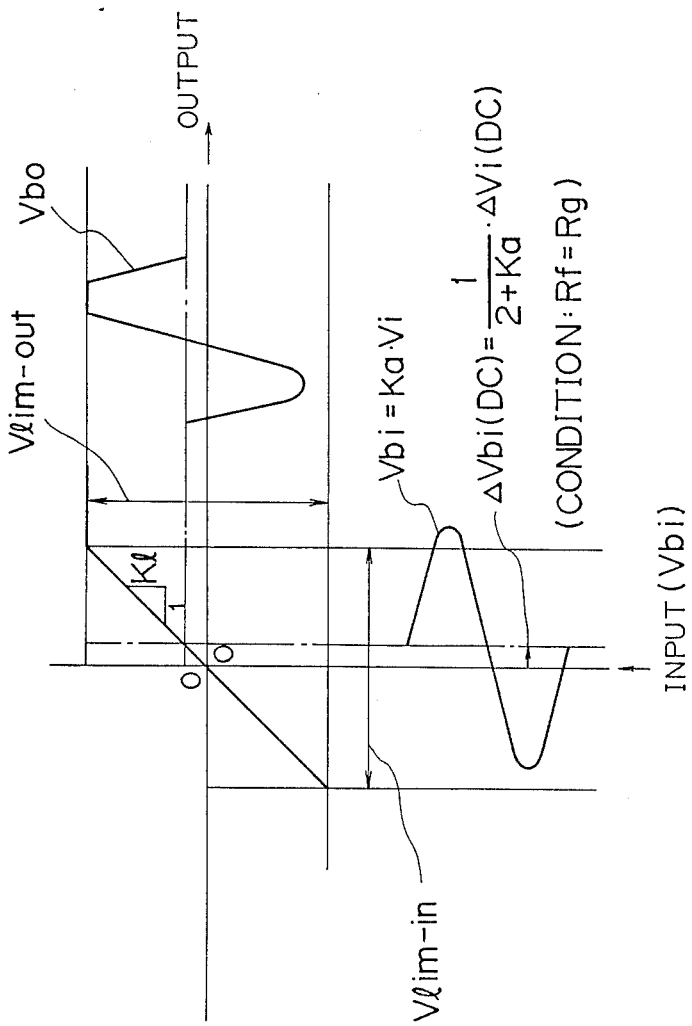

Next, when the DC component contained in the input signal Vi will be changed from the designed central value Vi(DC) to the maximum variation $\Delta$Vi(DC), the input/output characteristic of the limiter is represented as in FIG. 15A. If Rf=Rg similar to the equation (92), the DC operating point of the limiter input will be varied by $$\frac{1}{(2+ka)} \cdot \Delta Vi(DC).$$

Figure 15B:
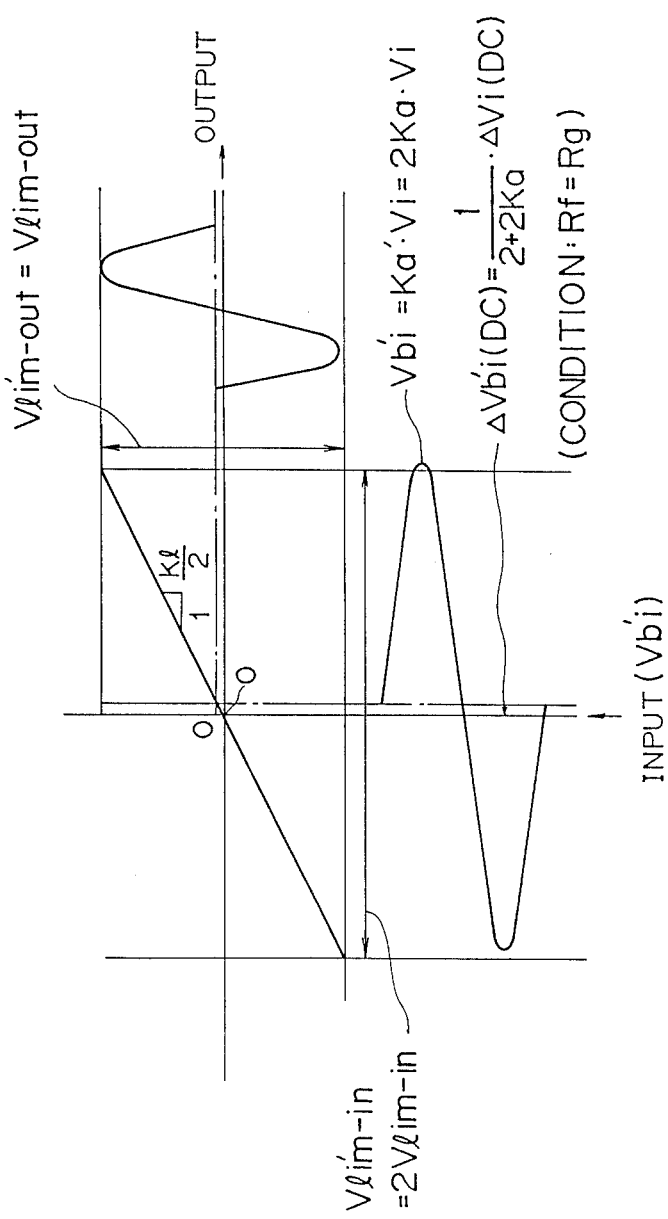

As a result, the limiter output becomes an asymmetrical limiting waveform, as illustrated in FIG. 15B, in a comparatively small amplitude input.

Assuming concrete numerical values in the following equations:

$$\left.\begin{array}{l} Vlim - in = 100 \ (mVp - p) \\ Ka = 6 \\ \text{therefore,} \\ \frac{Vlim - in}{Ka} \approx 16.7 \ (mVp - p)\text{: equivalent input limiting level} \\ \Delta Vi(DC) = 40 \ (mV) \end{array}\right\} \tag{97}$$

accordingly, $$|\Delta Vbi(DC)| = \frac{\Delta Vi(DC)}{2 + Ka} = 5 \ (mV) \tag{98}$$

In other words, with respect to the input signal having 100 mVp-p, the variation in the DC component of the input signal, i.e., $\Delta$Vi(DC) is equal to $\pm 5$ mV.

Now, if an amount to evaluate an asymmetrical characteristic of a signal output "$D_s$" is defined by:

$$D_s = \frac{|\Delta Vbi(DC)|}{Vlim - in}, \tag{99}$$

this amount "$D_s$" for the above-described numerical value example is given by:

$$D_e = 0.05 \tag{100}$$

where "$D_e$" implies the evaluated asymmetrical characteristic amount.

If the performance required for this amplifier circuit is defined by $D_s < 0.1$, there is no problem in the amplifier circuit, because the evaluated asymmetrical characteristic amount "$D_e$" is 0.05. However, if another specified evaluation amount "$D_s$" is newly set:

$$D_s < 0.03 \tag{101},$$

then the above example's evaluated amount "$D_e$" cannot satisfy the required performance, i.e., $0.05 > D_s$ (0.03).

According to the amplifier circuit constructed based upon the second basic idea, the desired performance thereof can be readily realized in the following way.

That is, the following conditions as shown in FIG. 15B are given:

$$\left.\begin{array}{l} Ka' = 2Ka \\ Vlim - in' = 2Vlim - in \\ Vlim - out' = Vlim - out \end{array}\right\} \tag{102}$$

It should be noted that to set "Vlim-in" twice, the resistance value "R1" of the common emitter resistor $R_E$-

COMMON is selected to be "2R₁" based upon the equation (95) in the preferred embodiment of FIG. 15.

From the above-described equations (96) and (102), the following equations are given:

$$Kl' = Kl/2$$
$$\frac{Vlim - in'}{Ka'} = \frac{2Vlim - in}{2Ka} = \frac{Vlim - in}{Ka} \quad (103)$$
furthermore,
$$Ka'Kl' = 2KaKl/2 = KaKl$$

The input/output characteristic of the circuit arrangement from the signal input terminal 4 to the first output terminal 5 is the same as in the previous example.

In this case, the above-described equations (99) and (100) are given by:

$$|\Delta Vbi(DC)'| = \frac{1}{2 + 2Ka} \cdot \Delta Vi(DC) \quad (104)$$
$$\approx 2.86 \, (mV)$$

$$D_e' = \frac{|\Delta Vbi(DC)'|}{2Vlim - in} = 0.0143 < 0.03 \, (D_s) \quad (105)$$

Consequently, the evaluated amount $D_e'$ for the asymmetrical characteristic can be suppressed, which is lower than a half amount of the permissible value, i.e., less than 0.03.

As is apparent from the equation (93), the variations $\Delta Vai(DC)$ and $\Delta Vci(DC)$ of the DC differential-input operating points for the preamplifier 1 and second amplifier 3 can be also automatically improved as follows:

$$|\Delta Vai(DC)| = |\Delta Vci(DC)| = \frac{1}{2 + 2Ka} \cdot Vi(DC)$$

In summary, to readily achieve the desirable performance of the amplifier circuit, the gain "Ka" of the preamplifier 1 employed in this amplifier circuit is set under the following conditions whenever the amplifier circuit 800 shown in FIG. 13 is operated in either the linear amplification mode, or non-linear amplification mode. That is to say, the gain "Ka" should be set in order that the DC differential-input unbalance in the preamplifier 1, first and second amplifiers 2 and 3 is reduced within the permissible limit.

Also, when the differential input circuit of the respective amplifier is arranged by, for instance, the bipolar transistors TR1 and TR2 as previously described in FIGS. 2 and 3, the constant base currents IB₁-BIAS and IB₂-BIAS flow through their input terminals.

Assuming that the base biasing currents "Ia" flow through the respective input terminals 1a and 1b of the preamplifier 1, the base biasing currents "Ib" flow through the respective input terminals 2a and 2b of the first amplifier 2, and also the base biasing currents "Ic" flow through the respective input terminals 3a and 3b of the second amplifier 3, as illustrated in FIG. 13. Under these conditions, if the current flowing through the resistor R22 having the resistance of "Rf" is defined by "If", and the current flowing through the resistor R21 having the resistance of "Rg" is defined by "Ig", then the following equation is given:

$$If + Ig = Ia + Ib + Ic \quad (107)$$

As a consequence, the DC balance in the differential inputs of the respective amplifiers can be precisely maintained when the resistance values "Ra", "Rb", "Rc", "Rf" and "Rg" of the corresponding resistors 7, 10, 13, 22 and 21 are preset so as to satisfy the following equation:

$$Ra \cdot Ia = Rb \cdot Ib = Rc \cdot Ic \quad (108)$$
$$= Rf \cdot If = Rg \cdot Ig$$

For instance, when the respective base biasing currents are designed as follows:

$$Ia = Ib = Ic = Io \quad (109),$$

then the following equation is obtained from the above equation (107):

$$If + Ig = 3Io \quad (110)$$

Also, from the above-described equation (108), the following relationships are obtained:

$$Ra \cdot Io = Rb \cdot Io = Rc \cdot Io \quad (111)$$
$$= Rf \cdot If = Rg \cdot Ig$$

Therefore, the following conditions are achieved:

$$Ra = Rb = Rc = Ro \quad (112)$$

If for instance, the current conditions are:

$$If = Ig = (3/2)Io \quad (113),$$

the following relationships are obtained from the above equation (110):

$$Rf = Rg = (2/3)Ro \quad (114)$$

Accordingly, all of the DC voltages appearing at the input terminals of the respective amplifiers 1 through 3 are equal to each other. The resistance values "Rf" and "Rg" of the resistors 22 and 21 can be freely selected if both the equations (110) and (111) are satisfied.

It should be understood that no such a specific setting condition is taken into account if the DC voltage drop across the resistors caused by the base biasing current are negligible with respect to the permissible values of the DC differential-input unbalance. Accordingly, for instance, it may set: Ra=Rb=Rc=0.

SEVENTH AMPLIFIER CIRCUIT 900

Figure 16:
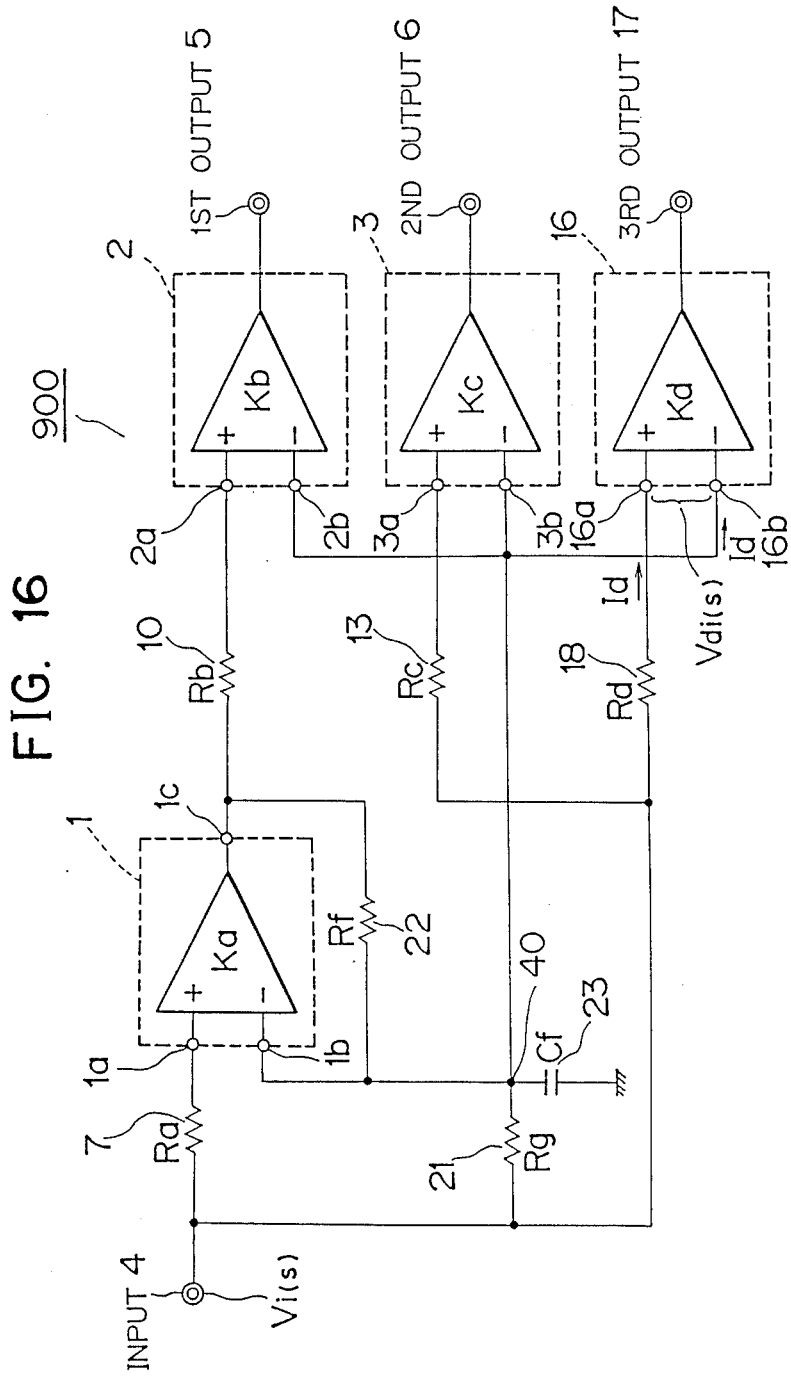
FIGS. 16, 17 and 18 are circuit diagrams of amplifier circuits belonging to the second basic idea of the invention, according to seventh through ninth preferred embodiments of the invention, respectively.

According to the second basic concept of the invention, another amplifier circuit 900, as illustrated in FIG. 16, having three outputs may be arranged.

In this case, the differential input Vdi(s) of the third amplifier 16 is expressed as follows:

$$Vdi(s) = \frac{Rg}{(1 + Ka)Rg + Rf} \cdot \frac{1 + RfCf \cdot s}{1 + \frac{RgRfCf \cdot s}{(1 + Ka)Rg + Rf}} \cdot Vi(s) \quad (115)$$

It should be noted that all of the differential inputs and outputs of the preamplifier 1, first and second amplifiers 2 and 3 of the seventh amplifier circuit 900 are the same as those of the sixth amplifier circuit 800 illustrated in FIG. 13. Consequently, the following equation can be satisfied:

$$V_{ai}(s) = V_{ci}(s) = V_{di}(s) \quad (116)$$

As is apparent from the foregoing, the particular advantage according to the second basic concept can be similarly given to the remaining differential input for the third amplifier 16. Moreover, the DC differential-input balance can be maintained as same as the sixth preferred embodiment shown in FIG. 13 by employing the following conditions, under the condition that the base biasing currents flowing through the respective input terminals 16a and 16b of the third amplifier 16 are defined by "Id" and the resistance of the resistor 18 is "Rd", which is similar to the above-described equations (107) and (108). That is to say, both the currents and resistance values are set by satisfying:

$$If + Ig = Ia + Ib + Ic + Id \quad (117)$$

$$Ra \cdot Ia = Rb \cdot Ib = Rc \cdot Ic = Rd \cdot Id \quad (118)$$
$$= Rf \cdot If = Rg \cdot Ig$$

Moreover, it is clear that the advantage of the present invention may be achieved in amplifier circuits having more output terminals than those of the above-describe amplifier circuits under the condition that the circuit arrangement made is maintained.

EIGHTH AMPLIFIER CIRCUIT 1000

An eighth amplifier circuit 1000 arranged based upon this second basic concept of the invention will now be described with reference to FIG. 17. As is easily seen from this circuit diagram, the circuit mode of this eighth amplifier circuit 1000 is similar to that of the third amplifier circuit 300 shown in FIG. 8, and is so arranged that the output of the preamplifier 1 is connected parallel to the first amplifier 2 and a third amplifier 24.

Figure 17:
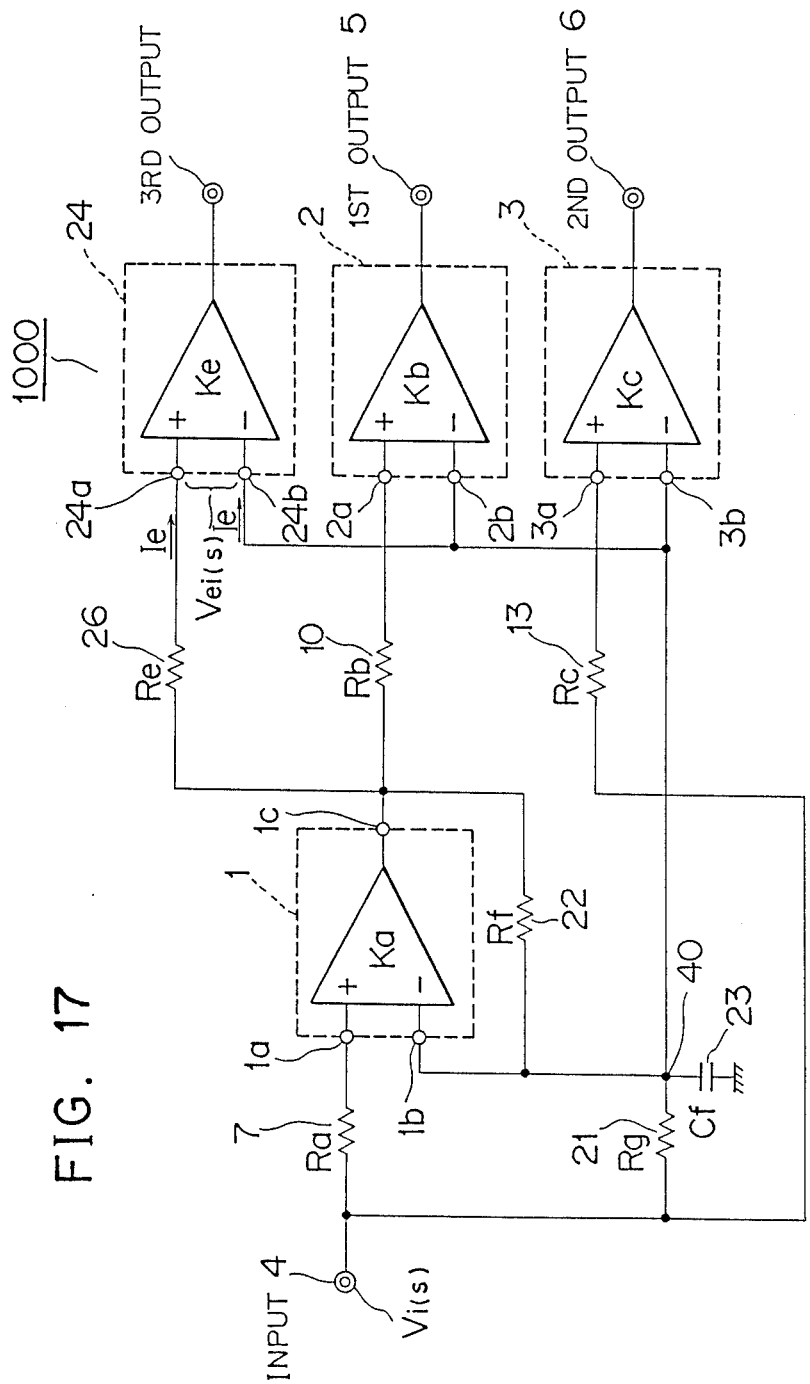

In FIG. 17, the eighth amplifier circuit 1000 includes this third amplifier 24 having a gain of "ke", a non-inverting input terminal 24a thereof and an inverting input terminal 24b thereof, and an output 25 thereof, and a resistor 26 having a resistance of "Re".

Then, a differential input Vei(s) of this third amplifier 24 is given by:

$$V_{ei}(s) = \frac{Rg}{(1 + Ka)Rg + Rf} \cdot \frac{1 + RfCf \cdot s}{1 + \frac{RgRfCf \cdot s}{(1 + Ka)Rg + Rf}} \cdot V_i(s) \quad (119)$$

All of the differential inputs and outputs of the preamplifier 1, first and second amplifiers 2 and 3 are the same as those of the sixth amplifier circuit 800 shown in FIG. 13. Therefore, an equation can be satisfied:

$$V_{bi}(s) = V_{ei}(s) \quad (120)$$

As a consequence, the particular advantage of the second basic concept can be similarly realized in the differential input of the third amplifier 24. Moreover, the same particular advantage as in the sixth preferred embodiment shown in FIG. 13 ca be achieved in that the DC differential-input balance can be precisely maintained under the following conditions. That is, if the base biasing currents flowing through the input terminals 24a and 24b of the third amplifier 24 are defined by "Ie", the currents and resistance values are set, similar to the above-described equations (107) and (108), so as to satisfy the following equations:

$$If + Ig = Ia + Ib + Ic + Ie \quad (121)$$

$$Ra \cdot Ia = Rb \cdot Ib = Rc \cdot Ic = Re \cdot Ie \quad (122)$$
$$= Rf \cdot If = Rg \cdot Ig$$

It is apparent from the foregoing that the above-described particular advantage of the invention may be realized in amplifier circuits, the output numbers of which are furthermore increased with having the same circuit mode.

NINTH AMPLIFIER CIRCUIT 1100

Figure 18:
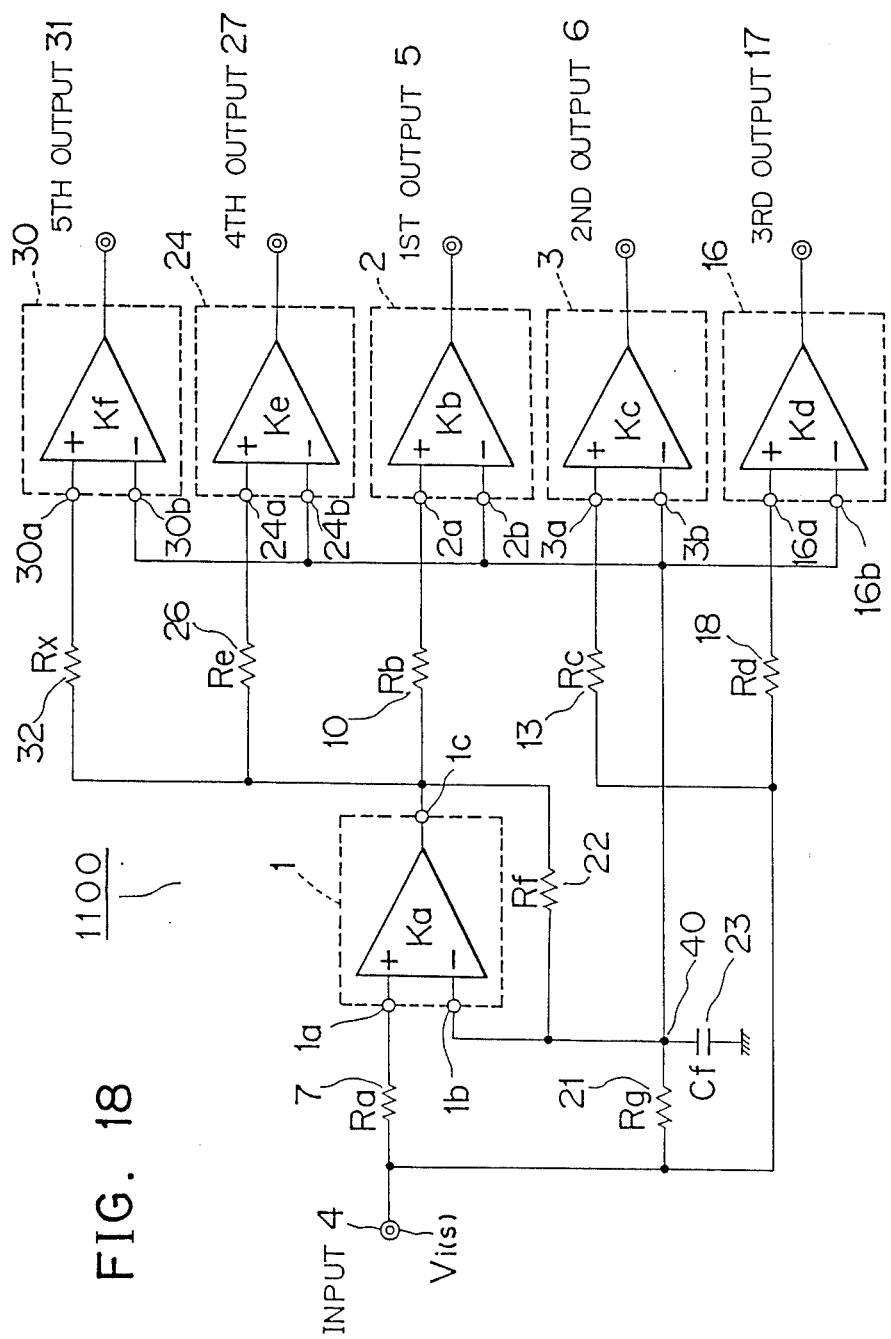

Referring now to FIG. 18, a description will be made of a ninth amplifier circuit 1100 arranged based upon the second basic concept of the invention. As easily understood from the circuit diagram of FIG. 18, this amplifier circuit 1100 is so arranged by combining the seventh amplifier circuit 900 shown in FIG. 16 with the eighth amplifier circuit 1000 shown in FIG. 17.

MODIFICATIONS

According to the second basic concept of the present invention, various modifications and changes may be obtained.

In FIG. 18, a plurality of amplifiers, for instance, may be parallel-connected to the output stage of the preamplifier 1 with maintaining the same connection mode as the fourth and fifth amplifier 24, and simultaneously, a plurality of amplifiers may be connected in parallel with the signal input 4 while maintaining the same connection mode as the second and third amplifiers 3 and 16. As a consequence, the particular advantage of the invention may be also achieved in this modified amplifier circuit In addition, all of the amplifiers shown in FIGS. 13, 16, 17 and 18 from which the signal outputs are derived, were so designed as an in-phase amplifier. It, of course, possible to employ an opposite-phase amplifier instead of the in-phase amplifier. In other words, this type of the amplifier may be determined by only considering the polarity of the output signal derived from the respective amplifiers, which never impair the particular advantage of the invention.

Now, the amplifier circuit 100, arranged based upon the first basic concept of the invention, will be summarized.

In the amplifier circuit 100 wherein the input signal Vi(s) containing the DC voltage component applied to the signal input 4 is amplified at least in the first and second differential-input amplifiers 2 and 3 to obtain the first and second output signals Vbo(s) and Vco(s), and the differential-input preamplifier 1 is connected to the input stage of the first differential-input amplifier 2, the non-inverting input terminals 1a of the differential-input preamplifier 1 is connected to the signal input 4;

the first resistor 24 is connected between the inverting input terminal 1b of the differential-input preamplifier 1 and the output terminal 1c thereof;

the series circuit constructed of the second resistor 25 and capacitor 23 is connected between the inverting input terminal 1b of the differential-input preamplifier 1 and the ground in such a manner that the capacitor 23 is directly connected to the ground;

a third resistor 21 is connected between the signal input 4 and the junction 22 among the second resistor 25 and the capacitor 23;

each of one input terminal 2b, 3b of the first and second differential-input amplifiers 2, 3 is connected to the junction 22 between the second resistor 25 and capacitor 23;

the remaining input terminals 2a of the first differential-input amplifiers 2 which is not connected to the junction 22 between the second resistor 25 and capacitor 23, is connected to the output terminal 1c of the differential-input preamplifier 1; and the remaining input terminal 3a of the second differential-input amplifier 3 which is not connected to the junction 22 between the second resistor 25 and capacitor 23 is connected to the signal input 4.

According to the first basic concept of the invention, the AC negative feedback path is formed via the first resistor 24 to the preamplifier 1, the input signal is added via the third resistor 21 to the junction 22 between the second resistor 25 and capacitor 23, which is connected between the feedback input terminal 1b of the preamplifier 1 and the ground, and the voltage appearing at this junction 22 is applied as a reference voltage to the inverting input terminals 2b, 3b of the first and second differential-input amplifiers 2 and 3.

Now, the amplifier circuit 800, arranged based upon the second basic concept of the invention, will be summarized.

In the amplifier circuit 800 wherein the input signal Vi(s) containing the DC voltage component applied to the signal input 4 is amplified at least in the first and second differential-input amplifiers 2 and 3 to obtain the first and second output signals Vbo(s) and Vco(s), and the differential-input preamplifier 1 is connected to the input stage of the first differential-input amplifier 2, the non-inverting input terminal 1a of the differential-input preamplifier 1 is connected to the signal input 4;

the inverting input terminal 1b of the differential-input preamplifier 1 is connected via the corresponding first and second resistors 21 and 22 to the signal input 4 and the output terminal 1c of the differential-input preamplifier 1, respectively;

each of one input terminal 2b, 3b of the respective first and second differential-input amplifiers 2 and 3 is connected to the inverting input terminal 1b of the differential-input preamplifier 1;

the capacitor 23 is connected between the inverting input terminal 1b of the differential-input preamplifier 1 and the ground;

the one input terminal 2a of the first differential-input amplifier 2 which is not connected to the non-inverting input terminal 1b of the differential-input preamplifier 1, is connected to the output terminal 1c of the differential input preamplifier 1; and the remaining input terminal 3a of the second differential-input amplifier 3 which is not connected to the inverting input terminal 1b of the second differential-input preamplifier 1, is connected to the signal input 4.

According to the second basic concept of the invention, the DC negative feedback path is formed via the second resistor 22 to the preamplifier 1, the input signal is added via the first resistor 21 to the feedback input terminal 1b of the preamplifier 1 and, the voltage appearing at this feedback input terminal 1b is applied as a reference voltage to the first and second differential-input amplifiers 2 and 3.

As previously described in detail, the DC differential-input balance of a plurality of differential-input amplifiers from which the signal outputs are derived, and of one differential-input preamplifier can be maintained by means of a single capacitor, according to the invention. As a consequence, when the amplifier circuit of the invention is manufactured in an integrated circuit (IC), the number of the IC pins to connect the DC balancing capacitor can be considerably reduced and therefore the number of the components externally connected to the IC chip, or module can be reduced. Then, lower cost amplifier circuits can be obtained.

What is claimed is:

1. An amplifier circuit comprising:
   one signal input for receiving an input signal containing a DC (direct current) voltage component;
   a differential-input preamplifier having a first input terminal for receiving one polarity input, a second input terminal for receiving the other polarity input opposite to that of the first input terminal, and an output terminal, said first input terminal being coupled to said one signal input;
   a first differential-input amplifier having a first input terminal for receiving one polarity input, a second input terminal for receiving the other polarity input opposite to that of the first input terminal thereof, and a first output terminal from which a first output signal of the amplifier circuit is derived, said first input terminal thereof being coupled to said output terminal of said preamplifier;
   a first resistor connected between the output terminal of said preamplifier and the second input terminal thereof so as to form an negative feedback path;
   a series circuit constructed of a second resistor and one capacitor, and connected between the second input terminal of said preamplifier and a ground, said capacitor being connected to the ground;
   a third resistor connected between said signal input and a junction of the series circuit; and,
   a second differential-input amplifier having a first input terminal for receiving said input signal via said signal input, a second input terminal, and a second output terminal from which a second output signal of the amplifier circuit is derived, said second input terminal of said second amplifier being connected together with said second input terminal of said first amplifier to the junction of said series circuit so as to apply a voltage appearing at said junction to both the first and second amplifiers as a reference voltage.

2. An amplifier circuit as claimed in claim 1, further comprising:
   a third differential-input amplifier having a first input terminal connected to both said first input terminal of said second amplifier and said signal input for receiving said input signal, a second input terminal connected to the junction of the series circuit for receiving said reference voltage, and a third output terminal from which a third output signal of the amplifier circuit is derived.

3. An amplifier circuit as claimed in claim 2, further comprising:
   a fourth differential-input amplifier having a first input terminal coupled to the output terminal of said preamplifier, a second input terminal connected to the junction of the series circuit, and a fourth output terminal from which a fourth output signal of the amplifier circuit is derived; and, a fifth differential-input amplifier connected parallel to said fourth differential input amplifier having a first input terminal coupled to the output terminal of the preamplifier, a second input terminal connected to the junction of the series circuit for receiving said reference voltage.

4. An amplifier circuit as claimed in claim 2, further comprising:
a fourth resistor connected between the output terminal of said preamplifier and the second input terminal of said first amplifier.

5. An amplifier circuit as claimed in claim 1, further comprising:
third differential-input amplifier having a first input terminal coupled to the output terminal of said preamplifier, a second input terminal connected to the junction of the series circuit for receiving said reference voltage, and a third output terminal from which a third output signal of the amplifier is derived.

6. An amplifier circuit as claimed in claim 5, further comprising:
a fourth resistor connected between the output terminal of said preamplifier and the second input terminal of said first amplifier.

7. An amplifier circuit as claimed in claim 1, further comprising:
a fourth resistor connected between the output terminal of said preamplifier and the second input terminal of said first amplifier.

8. An amplifier circuit comprising:
one signal input for receiving an input signal containing a DC (direct current) voltage component;
a differential-input preamplifier having a first input terminal for receiving one polarity input, a second input opposite to that of the first input terminal, and an output terminal, said first input terminal being coupled to said one signal input;
a first differential-input amplifier having a first input terminal for receiving one polarity input, a second input terminal for receiving the other polarity input opposite to that of the first input terminal thereof, and a first output terminal from which a first output signal of the amplifier circuit is derived, said first input terminal thereof being coupled to said output terminal of said preamplifier;
a first resistor connected between the output terminal of said preamplifier and the second input terminal thereof so as to form a negative feedback path;
one capacitor connected between said second input terminal of said preamplifier and a ground;
a second resistor connected between said signal input and a junction between one terminal of said capacitor and said second input terminal of said preamplifier; and,
a second differential-input amplifier having a first input terminal for receiving said input signal via said signal input, a second input terminal, and a second output terminal from which a second output signal of the amplifier circuit is derived, said second input terminal of said second amplifier being connected together with said second input terminal of said first amplifier to said junction between said one terminal of said capacitor and said second input terminal of said preamplifier so as to apply a voltage appearing at said junction to both the first and second amplifiers as a reference voltage.

9. An amplifier circuit as claimed in claim 8, further comprising:
a third differential-input amplifier having a first input terminal connected to both said first input terminal of said second amplifier and said signal input for receiving said input signal, a second input terminal connected to said junction for receiving said reference voltage, and a third output terminal from which a third output signal of the amplifier circuit is derived.

10. An amplifier circuit as claimed in claim 9, further comprising:
a fourth differential-input amplifier having a first input terminal coupled to the output terminal of said preamplifier, a second input terminal connected to said junction, and a fourth output terminal from which a fourth output signal of the amplifier circuit is derived; and,
a fifth differential-input amplifier connected parallel to said fourth differential input amplifier having a first input terminal coupled to the output terminal of the preamplifier, a second input terminal connected to said junction for receiving said reference voltage.

11. An amplifier circuit as claimed in claim 8, further comprising:
a third differential-input amplifier having a first input terminal coupled to the output terminal of said preamplifier, a second input terminal connected to said junction for receiving said reference voltage, and a third output terminal from which a third output signal of the amplifier is derived.

* * * * *